(12) United States Patent
Liao et al.

(10) Patent No.: US 12,272,106 B2
(45) Date of Patent: Apr. 8, 2025

(54) CODING METHOD AND APPARATUS

(71) Applicant: HUAWEI TECHNOLOGIES CO., LTD., Shenzhen (CN)

(72) Inventors: Shuri Liao, Shenzhen (CN); Shengyue Dou, Shenzhen (CN); Huiying Zhu, Shenzhen (CN); Pengpeng Dong, Shenzhen (CN); Zijie Xu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 104 days.

(21) Appl. No.: 18/180,066

(22) Filed: Mar. 7, 2023

(65) Prior Publication Data

US 2023/0222695 A1    Jul. 13, 2023

Related U.S. Application Data

(63) Continuation of application No. PCT/CN2020/113994, filed on Sep. 8, 2020.

(51) Int. Cl.
*G06T 9/00* (2006.01)
*H04N 19/46* (2014.01)

(52) U.S. Cl.
CPC .............. *G06T 9/00* (2013.01); *H04N 19/46* (2014.11)

(58) Field of Classification Search
CPC .................... G06T 9/00; H04N 19/46
See application file for complete search history.

(56) References Cited

U.S. PATENT DOCUMENTS

| | | | |
|---|---|---|---|
| 10,560,759 B1* | 2/2020 | Liu | H04N 21/816 |
| 2007/0283219 A1* | 12/2007 | Park | H03M 13/1171 |
| | | | 714/758 |
| 2016/0182088 A1* | 6/2016 | Sipos | G06F 3/064 |
| | | | 714/764 |
| 2017/0011533 A1* | 1/2017 | Ostermann | H04N 19/895 |
| 2021/0058989 A1* | 2/2021 | Simsek | H04L 47/283 |

FOREIGN PATENT DOCUMENTS

| | | | |
|---|---|---|---|
| CN | 101917625 A | | 12/2010 |
| CN | 102158696 A | | 8/2011 |
| CN | 103260033 A | * | 8/2013 |
| CN | 109068151 A | | 12/2018 |
| KR | 20130060976 A | | 6/2013 |

OTHER PUBLICATIONS

Jiang Hao et al: "Scalable Video Coding Based on the User's View for Real-Time Virtual Reality Applications", May 10, 2018, SAT 2015 18th International Conference, Austin, TX, USA, Sep. 24-27, 2015, pp. 766-775, XP047472909.
Hui Wang et al: "Random linear network coding with ladder-shaped global coding matrix for robust video transmission", Journal of Visual Communication and Image Representation, Academic Press, Inc, US, vol. 22, No. 3, Jul. 29, 2010, pp. 203-212, XP028172656.

\* cited by examiner

*Primary Examiner* — Zhubing Ren

(57) ABSTRACT

A coding method and an apparatus are provided. XR data of different dimensions or different QoS requirements are distinguished during coding.

11 Claims, 5 Drawing Sheets

CODING METHOD AND APPARATUS

CROSS-REFERENCE TO RELATED APPLICATIONS

This application is a continuation of International Application No. PCT/CN2020/113994, filed on Sep. 8, 2020, the disclosure of which is hereby incorporated by reference in its entirety.

TECHNICAL FIELD

This disclosure relates to the field of communication technologies, and in particular, to a coding method and an apparatus.

BACKGROUND

In a wireless communication network, an extended reality (XR) technology has advantages such as multi-view and strong interaction, can provide brand-new visual user experience, and has great application value and great business potential. XR includes technologies such as virtual reality (VR), augmented reality (AR), and mix reality (MR), and can be widely applied to many fields such as entertainment, gaming, medical care, advertising, industry, online education, tactile Internet, and engineering.

Transmission of XR data in a wireless network may fail due to impact of radio channel fading. Therefore, the XR data that fails to be transmitted needs to be retransmitted. However, retransmission increases a transmission delay of the XR data. Because the XR data has a real-time transmission requirement in the network, the real-time transmission requirement of the XR data cannot be ensured due to retransmission. Consequently, this causes uncomfortable experience to users such as frame freezing, erratic display, or dizziness, and user experience of the XR service is compromised. Therefore, how to correctly complete transmission of XR data in a low-delay manner to improve user experience of the XR service becomes an urgent problem to be resolved.

SUMMARY

Embodiments of this application provide a coding method and an apparatus.

According to a first aspect, an embodiment of this application provides a coding method. The method may be performed by a terminal or a network device, or may be performed by a component (for example, a processor, a chip, or a chip system) in the terminal or the network device, and includes: obtaining T1 first to-be-coded data units and T2 second to-be-coded data units, where T1 and T2 are integers greater than or equal to 1; coding the T1 first to-be-coded data units and the T2 second to-be-coded data units based on at least one of an extended reality data type corresponding to the T1 first to-be-coded data units or an extended reality data type corresponding to the T2 second to-be-coded data units, to obtain K coded data units, where K is an integer greater than or equal to T1+T2; and outputting the K coded data units.

According to the foregoing method, in a process of coding XR data, coding of the XR data can be completed based on different dimensions or different QoS requirements of the XR data, so as to improve coding efficiency of the XR data, and improve utilization efficiency of limited air interface resources.

A specific coding type is not limited in this disclosure. For example, the coding type may be packet-based coding, convolutional coding, or random linear coding, or the coding type may be network coding (for example, packet-based network coding, convolutional network coding, or random linear network coding).

With reference to the first aspect, in some implementations of the first aspect, the extended reality data type corresponding to the T1 first to-be-coded data units includes extended reality base layer data, and the extended reality data type corresponding to the T2 second to-be-coded data units includes extended reality enhancement layer data. Optionally, the extended reality base layer data and the extended reality enhancement layer data may be extended reality data obtained by performing source coding on XR source data, and source coding may be, for example, high efficiency video coding (HEVC) or scalability extension of HEVC (SHVC). According to this implementation, in a process of coding XR data, coding of the XR data can be completed based on requirements of different XR data types for QoS, so as to improve coding efficiency of the XR data, improve utilization efficiency of limited air interface resources, and ensure a QoS requirement of the XR data by using a limited resource with reference to coding.

With reference to the first aspect, in some implementations of the first aspect, the extended reality data type corresponding to the T1 first to-be-coded data units includes extended reality in-field of view (FoV) data, and the extended reality data type corresponding to the T2 second to-be-coded data units includes extended reality out-of-FoV data. Optionally, the extended reality in-FoV data and the extended reality out-of-FoV data may be extended reality data obtained by performing FoV source coding on XR source data. In FoV source coding, there are an in-angle-of-view part and an out-of-angle-of-view part for the XR source data. Generally, an angle of view of an FoV is approximately 60 to 150 degrees. The in-angle-of-view part corresponds to the extended reality in-FoV data, and the out-of-angle-of-view part corresponds to the extended reality out-of-FoV data. According to this implementation, in a process of coding XR data, coding of the XR data can be completed based on a visual presentation requirement of the XR data, so as to improve coding efficiency of the XR data, improve utilization efficiency of limited air interface resources, and improve visual experience of users on an XR service by using a limited resource with reference to coding.

With reference to the first aspect, in some implementations of the first aspect, the extended reality data type corresponding to the T1 first to-be-coded data units includes video data, and the extended reality data type corresponding to the T2 second to-be-coded data units includes data (for example, audio data) other than the video data type. According to this implementation, in a process of coding XR data, coding of the XR data can be completed based on a visual presentation requirement and another user awareness (for example, auditory) presentation requirement of the XR data, so as to improve coding efficiency of the XR data, improve utilization efficiency of limited air interface resources, and improve integrated experience of users on an XR service by using a limited resource with reference to coding.

With reference to the first aspect, in some implementations of the first aspect, the coding the T1 first to-be-coded data units and the T2 second to-be-coded data units based on at least one of an extended reality data type corresponding to the T1 first to-be-coded data units or an extended reality data type corresponding to the T2 second to-be-coded data units specifically includes:

obtaining a coding matrix H based on the least one of the extended reality data type corresponding to the T1 first to-be-coded data units or the extended reality data type corresponding to the T2 second to-be-coded data units; and coding the T1 first to-be-coded data units and the T2 second to-be-coded data units based on the coding matrix H. Optionally, the coding matrix H includes a coding submatrix Ĥ, the coding submatrix Ĥ includes T1 first coding vectors and T2 second coding vectors, the T1 first coding vectors respectively correspond to the T1 first to-be-coded data units, and the T2 second coding vectors respectively correspond to the T2 second to-be-coded data units.

In a possible implementation of the first coding vector and the second coding vector, a quantity of non-zero coefficients included in any one of the T1 first coding vectors is greater than a quantity of non-zero coefficients included in any one of the T2 second coding vectors. Optionally, the quantity of non-zero coefficients included in the any one of the T2 second coding vectors is less than a coding depth M.

In another possible implementation of the first coding vector and the second coding vector, a quantity of non-zero coefficients included in one of the T1 first coding vectors is greater than a quantity of non-zero coefficients included in one of the T2 second coding vectors. Optionally, the quantity of non-zero coefficients included in the any one of the T2 second coding vectors is less than a coding depth M.

According to the foregoing implementations of the first coding vector and the second coding vector, coding protection stronger than that of the second to-be-coded data unit can be provided for the first to-be-coded data unit based on the extended reality data type corresponding to the first to-be-coded data unit and the extended reality data type corresponding to the second to-be-coded data unit.

For example, when the extended reality data type corresponding to the T1 first to-be-coded data units includes the extended reality base layer data, and the extended reality data type corresponding to the T2 second to-be-coded data units includes the extended reality enhancement layer data, because the extended reality base layer data can provide basic extended reality experience for users, preferentially providing stronger coding protection for the extended reality base layer data can ensure basic extended reality experience of users. On this basis, providing coding protection for the extended reality enhancement layer data as much as possible can provide enhanced extended reality experience for users.

For another example, when the extended reality data type corresponding to the T1 first to-be-coded data units includes the extended reality in-FoV data, and the extended reality data type corresponding to the T2 second to-be-coded data units includes the extended reality out-of-FoV data, because the extended reality in-FoV data can present, to users, extended reality visual content that is more concerned by users than the extended reality out-of-FoV data, preferentially providing stronger coding protection for the extended reality in-FoV data can preferentially ensure extended reality experience that is concerned by users.

According to a second aspect, an embodiment of this disclosure provides an apparatus to implement the method according to any one of the first aspect or the possible implementations of the first aspect. The apparatus includes a corresponding unit or component configured to perform the foregoing method. The unit included in the apparatus may be implemented by software and/or hardware. The apparatus may be, for example, a terminal or a network device, or may be a chip, a chip system, or a processor that supports the terminal or the network device in implementing the foregoing method.

According to a third aspect, an embodiment of this disclosure provides an apparatus including a processor. The processor is coupled to a memory, the memory is configured to store a program or instructions, and when the program or the instructions are executed by the processor, the apparatus is enabled to implement the method according to any one of the first aspect or the possible implementations of the first aspect.

According to a fourth aspect, an embodiment of this disclosure provides a computer-readable storage medium. The computer-readable storage medium stores a computer program or instructions, and when the computer program or the instructions are executed, a computer is enabled to perform the method according to any one of the first aspect or the possible implementations of the first aspect.

According to a fifth aspect, an embodiment of this disclosure provides a computer program product. The computer program product includes computer program code, and when the computer program code is run on a computer, the computer is enabled to perform the method according to any one of the first aspect or the possible implementations of the first aspect.

According to a sixth aspect, an embodiment of this disclosure provides a chip, including a processor. The processor is coupled to a memory, the memory is configured to store a program or instructions, and when the program or the instructions are executed by the processor, the chip is enabled to implement the method according to any one of the first aspect or the possible implementations of the first aspect.

According to a seventh aspect, an embodiment of this disclosure provides a communication system, including the apparatus according to the second aspect or the apparatus according to the third aspect.

DESCRIPTION OF EMBODIMENTS

Figure 1:
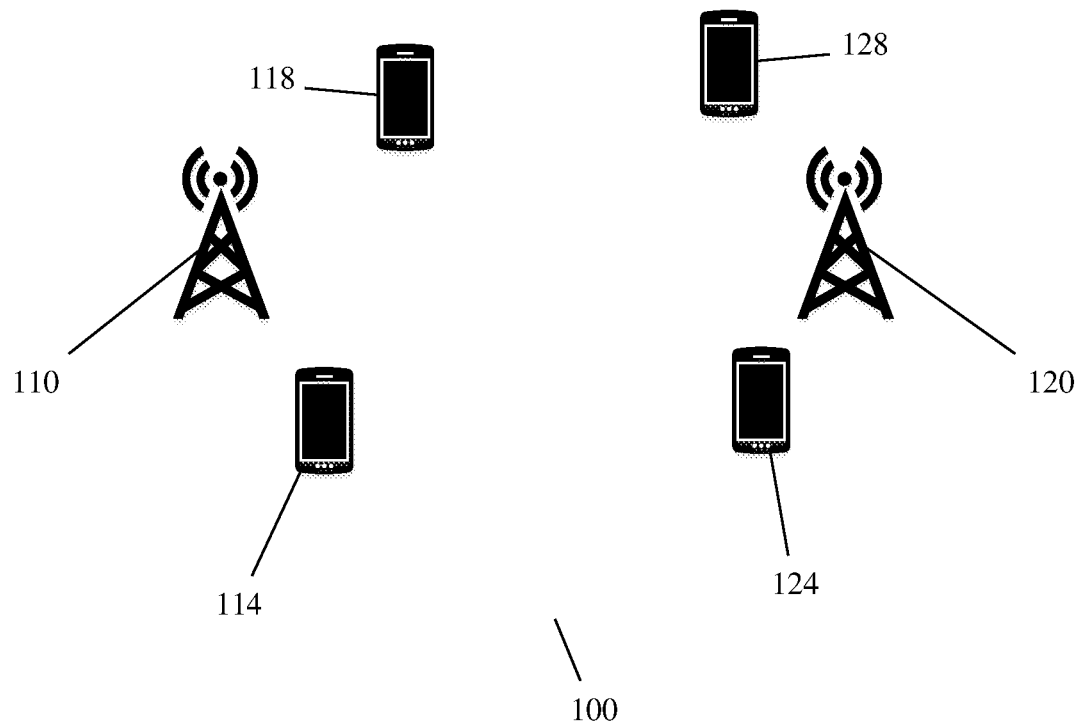
FIG. 1 is a schematic diagram of a communication system to which an embodiment of this disclosure is applied.

A method and an apparatus provided in embodiments of this disclosure may be applied to a communication system. FIG. 1 is a schematic diagram of a structure of a communication system. The communication system 100 includes one or more access network devices (an access network device 110 and an access network device 120 shown in the figure), and one or more terminals that communicate with the one or more access network devices. In FIG. 1, a terminal 114 and a terminal 118 communicate with the access network device 110, and a terminal 124 and a terminal 128 communicate with the access network device 120. It can be understood that the access network device and the terminal may also be referred to as communication devices.

The method and the apparatus provided in embodiments of this disclosure may be applied to various communication systems, for example, a fourth generation (4G) communication system, a 4.5G communication system, a 5G communication system, a system integrated by a plurality of communication systems, or a future evolved communication system (for example, a 5.5G communication system or a 6G communication system). The communication systems include, for example, a long term evolution (LTE) system, a new radio (NR) system, a wireless fidelity (Wi-Fi) system, a communication system related to the 3rd generation partnership project (3GPP), and another communication system of this type.

Figure 2:
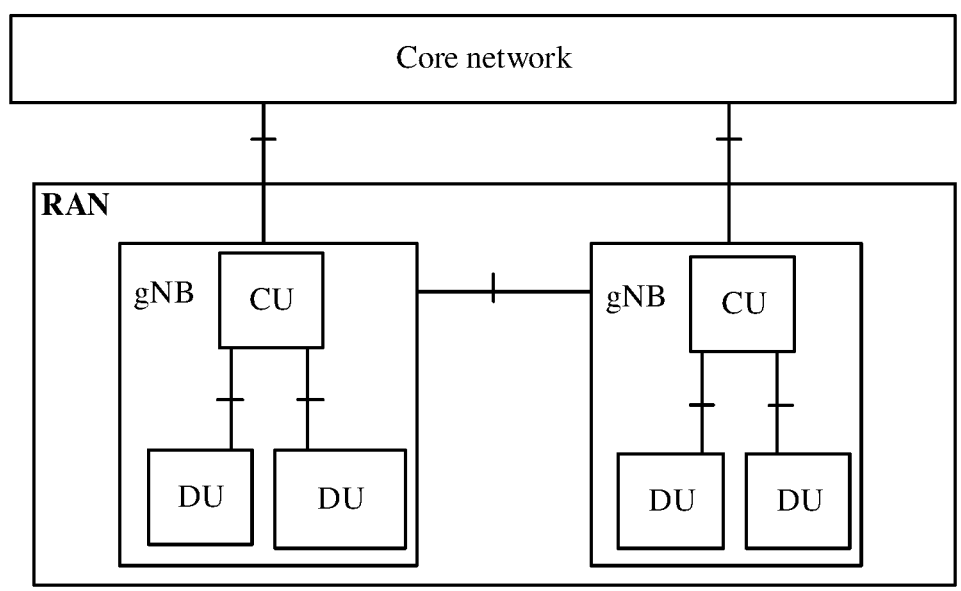
FIG. 2 is a schematic diagram of an example architecture of a communication system.

FIG. 2 is a schematic diagram of an example of a possible architecture of a communication system. As shown in FIG. 2, a network device in a radio access network (RAN) is a base station (for example, a gNodeB or a gNB) with an architecture in which a central unit (CU) and a distributed unit (DU) are separated. The RAN may be connected to a core network (for example, an LTE core network or a 5G core network). It can be understood that the base station is divided into the CU and the DU from the perspective of logical functions. The CU and the DU may be physically separated or deployed together. A plurality of DUs may share one CU. One DU may alternatively be connected to a plurality of CUs (not shown in the figure). The CU and the DU may be connected through an interface, for example, an F1 interface. The CU and the DU may be obtained through division based on protocol layers of a wireless network. For example, functions of a packet data convergence protocol (PDCP) layer and a radio resource control (radio resource control, RRC) layer are distributed to the CU, but functions of a radio link control (radio link control, RLC) layer, a media access control (MAC) layer, and a physical layer are distributed to the DU. It can be understood that division into processing functions of the CU and the DU based on the protocol layers is merely an example, and there may be other division. For example, the CU or the DU may have functions of more protocol layers through division. For example, the CU or the DU may alternatively have some processing functions of the protocol layers through division. In a design, some functions of the RLC layer and functions of a protocol layer above the RLC layer are distributed to the CU, and remaining functions of the RLC layer and functions of a protocol layer below the RLC layer are distributed to the DU. In another design, functions of the CU or the DU may alternatively be obtained through division based on a service type or another system requirement. For example, through delay-based division, a function whose processing time needs to meet a delay requirement is distributed to the DU, and a function whose processing time does not need to meet the delay requirement is distributed to the CU. The network architecture shown in FIG. 2 may be applied to a 5G communication system, or may share one or more components or resources with an LTE system. In another design, the CU may alternatively have one or more functions of the core network. One or more CUs may be disposed in a centralized manner or a separated manner. For example, the CUs may be disposed on a network side for ease of centralized management. The DU may have a plurality of radio frequency functions, or the radio frequency functions may be set remotely.

The function of the CU may be implemented by one entity, or the CU may be further divided into a control plane (CP) and a user plane (UP). To be specific, the control plane of the CU (CU-CP) and the user plane of the CU (CU-UP) may be implemented by different function entities, and the CU-CP and the CU-UP may be coupled to the DU to jointly implement a function of the base station.

It can be understood that embodiments provided in this application are also applicable to an architecture in which a CU and a DU are not separated.

The access network device in this application may be any device having a wireless transceiver function, and includes but is not limited to an evolved NodeB (NodeB, eNB, or eNodeB, evolved NodeB) in LTE, a base station (gNodeB or gNB) or a transmission receiving/reception point (TRP) in NR, a subsequently evolved NodeB in 3GPP, an access node in a Wi-Fi system, a wireless relay node, a wireless backhaul node, a core network device, and the like. A base station may be a macro base station, a micro base station, a picocell base station, a small cell, a relay station, a balloon station, or the like. A plurality of base stations may support the foregoing networks using a same technology, or may support the foregoing networks using different technologies. The base station may include one or more co-site or non-co-site TRPs. Alternatively, the access network device may be a server (for example, a cloud server), a radio controller in a cloud radio access network (CRAN) scenario, a CU, and/or a DU. Alternatively, the access network device may be a server, a wearable device, a machine-to-machine communication device, a vehicle-mounted device, a smart display, or the like. An example in which the access network device is a base station is used below for description. The plurality of access network devices may be base stations of a same type, or may be base stations of different types. The base station may communicate with the terminal device, or may communicate with the terminal device via a relay station. The terminal device may communicate with a plurality of base stations using different technologies. For example, the terminal device may communicate with a base station supporting an LTE network, or may communicate with a base station supporting a 5G network, or may support dual connections to the base station supporting the LTE network and the base station supporting the 5G network.

The terminal in this application is a device having a wireless transceiver function, and may be deployed on land, including an indoor or outdoor device, a handheld device, a wearable device, or a vehicle-mounted device, or may be deployed on the water (for example, on a ship), or may be deployed in the air (for example, on an airplane, a balloon, or a satellite). The terminal may be a mobile phone, a tablet computer, a computer having a wireless transceiver function, a virtual reality (VR) terminal device, an augmented reality (augmented reality, AR) terminal device, a terminal in industrial control, a vehicle-mounted terminal device, a terminal in self-driving, a terminal in assisted driving, a terminal in remote medical, a terminal in a smart grid, a terminal in transportation safety, a terminal in a smart city, a terminal in a smart home, or the like. An application scenario is not limited in embodiments of this application. The terminal may also be referred to as a terminal device, user equipment (UE), an access terminal device, a vehicle-mounted terminal, an industrial control terminal, a UE unit, a UE station, a mobile station, a remote station, a remote terminal device, a mobile device, a UE terminal device, a wireless communication device, a machine terminal, a UE proxy, a UE apparatus, or the like. The terminal may be fixed or mobile.

By way of example and not limitation, the terminal in this application may be a wearable device. The wearable device may also be referred to as a wearable intelligent device, and is a general term of a wearable device that is intelligently designed and developed for daily wear by using a wearable technology, for example, glasses, gloves, a watch, clothing, and shoes. The wearable device is a portable device that can be directly worn on the body or integrated into clothes or an accessory of users. The wearable device is not only a hardware device, but also implements a powerful function through software support, data exchange, and cloud interaction. Broadly, wearable intelligent devices include full-featured and large-sized devices that can implement complete or partial functions without depending on smartphones, for example, smart watches or smart glasses, and include devices that focus on only a specific type of application functions and that need to be used together with another device such as a smartphone, for example, various smart bands and smart jewelry used for vital sign monitoring.

In this application, the terminal may be a terminal in an internet of things (IoT) system. IoT is an important component in development of future information technologies. A main technical feature of IoT is to connect objects to a network by using a communication technology, to implement an intelligent network of human-machine interconnection and thing-thing interconnection. The terminal in this application may be a terminal in machine type communication (MTC). The terminal in this application may be a vehicle-mounted module, a vehicle-mounted assembly, an on-board component, an automotive chip, or an on-board unit that is built in a vehicle as one or more components or units. The vehicle may implement a method in this application by using the vehicle-mounted module, the vehicle-mounted assembly, the on-board component, the automotive chip, or the on-board unit that is built in the vehicle. Therefore, embodiments of this application may be applied to internet of vehicles, for example, vehicle-to-everything (V2X), long term evolution-vehicle (LTE-V), and vehicle-to-vehicle (V2V).

Alternatively, the terminal in this application may be a VR terminal, an AR terminal, or an MR terminal. The VR terminal, the AR terminal, and the MR terminal each may be referred to as an XR terminal. The XR terminal may be, for example, a head-mounted device (for example, a helmet or glasses), or may be an all-in-one machine, or may be a television, a display, a car, a vehicle-mounted device, a tablet, a smart display, a holographic projector, a video player, a remote control robot, a tactile internet terminal, or the like. The XR terminal can present XR data to users, and users can experience diversified XR services by wearing or using the XR terminal. The XR terminal may access a network in a wireless or wired manner, for example, by using Wi-Fi or a 5G system.

In a wireless communication network, an XR technology has advantages such as multi-view and strong interaction, can provide brand-new user experience, and has great application value and great business potential. XR includes technologies such as VR, AR, and MR, and can be widely applied to many fields such as entertainment, gaming, medical care, advertising, industry, online education, and engineering. The VR technology is mainly to render visual and audio scenarios to simulate sensory stimulation of vision and audio in the real world to users as much as possible. The VR technology usually requires users to wear XR terminals (for example, head-mounted devices) to simulate vision and/or auditory sensation of the users. The VR technology may further perform action tracking on the users, to update simulated visual and/or auditory content in time. The AR technology is mainly to provide additional visual and/or auditory information or manually generated content in a real environment perceived by users. The users may perceive the real environment directly (for example, without performing sensing, processing, and rendering) or indirectly (for example, by performing transmission using a sensor), and further perform enhancement processing. The MR technology is to insert some virtual elements into physical scenarios, to provide users with immersive experience that these elements are a part of a real scenario. A network device may process and transmit data (which may be referred to as XR data) generated by an XR service. For example, a cloud network device may perform rendering and coding (for example, source coding) on XR source data, and transmit XR data to an XR terminal via a network device in a core network and/or an access network. The XR terminal provides diversified XR experience (for example, immersive experience, visual experience, interaction experience, or device experience) for users by processing the XR data. The XR experience may be evaluated from a plurality of different dimensions, for example, including one or more of the following evaluation dimensions: image definition, image smoothness, image distortion, image stereoscopy, an image black border, image smearing, sound quality, a sound effect, a field of view, frame freezing, erratic display, dizziness, audio-to-video synchronization, interaction freedom, an interaction operation response speed, interaction operation precision, an interaction content loading speed, terminal wearing comfort, terminal wearing fatigue, terminal battery life, terminal portability, terminal visual impairment friendliness, or the like.

Transmission of XR data in a wireless network may fail due to impact of radio channel fading. Therefore, the XR data that fails to be transmitted needs to be retransmitted. However, retransmission increases a transmission delay of the XR data. Because the XR data has a real-time transmission requirement in the network, the real-time transmission requirement of the XR data cannot be ensured due to retransmission. Consequently, this causes uncomfortable experience to users such as frame freezing, erratic display, or dizziness, and user experience of the XR service is compromised. Therefore, how to correctly complete transmission of XR data in a low-delay manner to improve user experience of the XR service becomes an urgent problem to be resolved.

To effectively reduce frequent feedback overheads and performance losses in a communication process, network coding becomes an important technology. In other words, a to-be-transmitted data unit is coded and redundant information is added to resolve a problem such as a packet loss or an error in wireless communication, so as to improve data transmission reliability.

There are many types of network coding, such as packet-based network coding, convolutional network coding, and random linear network coding (RLNC). In these coding technologies, a to-be-coded data unit is coded to obtain a corresponding coded data unit. For example, in FIG. 3, N to-be-coded data units are coded to obtain K coded data units. A coding bit rate may be approximately represented as R=N/K. Because K is generally greater than or equal to N, R is generally greater than 0 and less than or equal to 1. A data unit in this application may also be referred to as a data packet, a data segment, or a data block.

Figure 3:
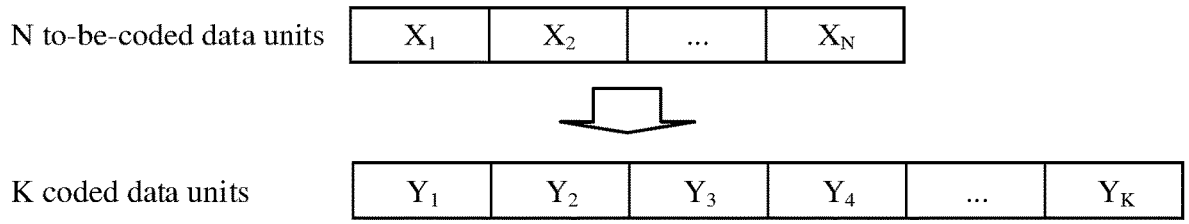
FIG. 3 is a schematic diagram of coding according to this disclosure.

RLNC is used as an example. With reference to FIG. 3, the N to-be-coded data units are respectively represented as $X_1, X_2, \ldots, X_N$, and the N to-be-coded data units may be included in one original data block. In this application, a data block may also be referred to as a data group, a data generation, or a data batch. In this disclosure, the original data block may also be referred to as a to-be-coded data block. When the N to-be-coded data units are coded through RLNC, the N to-be-coded data units may be multiplied by K coding vectors to obtain the K coded data units (which are respectively represented as $Y_1, Y_2, \ldots, Y_K$). For example, the K coding vectors may be respectively represented as $[g_{1,1}, g_{1,2}, \ldots, g_{1,N}], [g_{2,1}, g_{2,2}, \ldots, g_{2,N}], \ldots,$ and $[g_{K,1}, g_{K,2}, \ldots, g_{K,N}]$, where each coding vector includes N coding coefficients, and the $n^{th}$ coding coefficient in the $k^{th}$ coding vector is represented as $g_{k,n}$. A coding coefficient in a coding vector may be randomly selected from a finite field or a Galois field (GF). The GF is a field including a limited quantity of elements, and GF(q) may be used to represent a GF including q elements. The K coded data units $Y_1, Y_2, \ldots, Y_K$ obtained by multiplying the N to-be-coded data units $X_1, X_2, \ldots, X_N$ by the K coding vectors may meet:

$$Y_1 = g_{1,1}*X_1 + g_{1,2}*X_2 + \ldots + g_{1,N}*X_N$$

$$Y_2 = g_{2,1}*X_1 + g_{2,2}*X_2 + \ldots + g_{2,N}*X_N$$

$$\ldots$$

$$Y_K = g_{K,1}*X_1 + g_{K,2}*X_2 + \ldots + g_{K,N}*X_N$$

The $k^{th}$ coded data unit $Y_k = g_{k,1}*X_1 + g_{k,2}*X_2 + \ldots + g_{k,N}*X_N$ may carry, in a header, information indicating a coding vector $[g_{k,1}, g_{k,2}, \ldots, g_{k,N}]$, so that a receiving end can decode received data based on the coding vector. It can be understood that the K coding vectors may be included in one coding matrix or coding submatrix, and the coding matrix or the coding submatrix meets:

$$\begin{bmatrix} g_{1,1} & g_{1,2} & \cdots & g_{1,N} \\ g_{2,1} & g_{2,2} & \cdots & g_{2,N} \\ \vdots & \vdots & \ddots & \vdots \\ g_{K,1} & g_{K,2} & \cdots & g_{K,N} \end{bmatrix}$$

That the N to-be-coded data units are multiplied by K coding vectors to obtain the K coded data units may also be understood as that the N to-be-coded data units are multiplied by the coding matrix (or the coding submatrix) to obtain the K coded data units. It can be understood that the coding matrix may also be referred to as a generator matrix, a convolutional generator matrix, or a coefficient matrix. For ease of description, the vector in this disclosure is written in a form of a row vector. However, the vector may also be represented in a form of a column vector. This is not limited in this disclosure.

XR data is coded through network coding and then transmitted, so that a transmission success rate of the XR data can be increased to some extent. The XR data is characterized by a plurality of dimensions or a plurality of quality of service (QoS) requirements. For example, the XR data may include data in a plurality of different dimensions, for example, video data and audio data. For another example, the XR data may include data with a high QoS requirement and data with a low QoS requirement. Although the transmission success rate of the XR data can be increased after the XR data is coded through network coding and then transmitted, because network coding does not consider different dimensions or different QoS requirements of the XR data, coding efficiency is reduced, and efficient utilization of limited air interface resources is limited.

This disclosure provides an XR data coding method. In this method, XR data of different dimensions or different QoS requirements is distinguished during coding, so as to improve coding efficiency of the XR data, and improve utilization efficiency of limited air interface resources.

The embodiment provided in this disclosure is applicable to a plurality of different scenarios. For example, FIG. 4 to FIG. 7 are schematic diagrams of several scenarios to which embodiments of this application are applicable.

Figure 4:
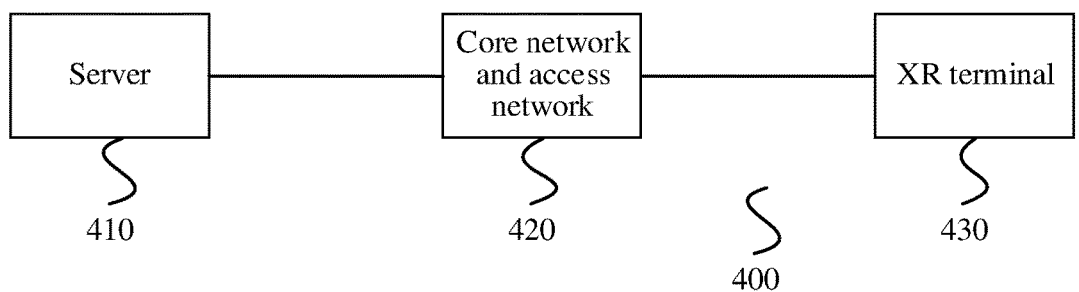
FIG. 4 to FIG. 7 are schematic diagrams of several scenarios to which embodiments of this disclosure are applicable.

FIG. 4 is a schematic diagram of a scenario to which an embodiment of this disclosure is applicable. FIG. 4 shows a system 400, including a server 410, a core network and access network 420 (which may be referred to as a transmission network 420 for short, for example, an LTE network, a 5G network, or a 6G network), and an XR terminal 430. The server 410 may be configured to code, decode, and render XR source data, the transmission network 420 is for transmitting XR data, and the XR terminal 430 provides diversified XR experience for users by processing the XR data. It can be understood that another apparatus may be further included between the transmission network 420 and the XR terminal 430, for example, another terminal (for example, a mobile phone, a notebook computer, or a vehicle-mounted terminal) and/or a network device (for example, a relay device, an integrated access backhaul (IAB) device, a Wi-Fi router, or a Wi-Fi access point). The XR terminal 430 obtains the XR data from the transmission network 420 via the another terminal and/or the network device.

Figure 5:
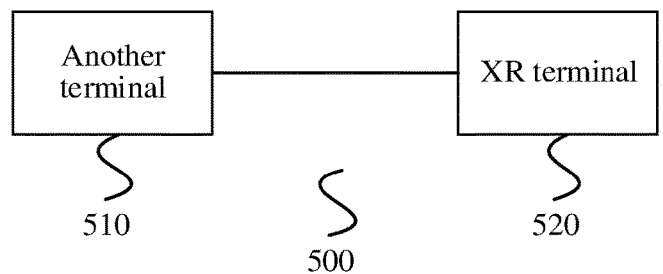

FIG. 5 is a schematic diagram of another scenario to which an embodiment of this application is applicable. FIG. 5 shows a system 500, including an XR terminal 520 and another terminal 510. The another terminal 510 is a terminal other than the XR terminal 520, and the another terminal 510 may be an XR terminal, or may be a common terminal (which may also be referred to as a non-XR terminal). The another terminal 510 may transmit XR data to the XR terminal 520. For example, the another terminal 510 may project the XR data onto the XR terminal 520. For another example, the another terminal 510 and the XR terminal 520 are vehicle-mounted terminals, and the vehicle-mounted terminals may exchange XR data. It can be understood that the another terminal 510 may be further connected to a transmission network (for example, an LTE network, a 5G network, or a 6G network), to obtain XR data from the transmission network or send data to the transmission network.

Figure 6:
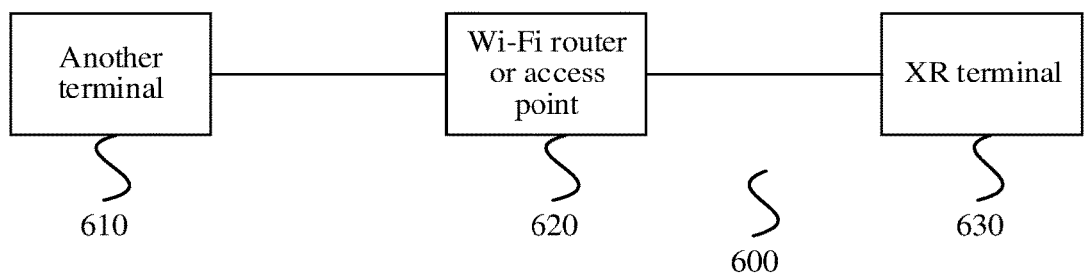

FIG. 6 is a schematic diagram of another scenario to which an embodiment of this application is applicable. FIG. 6 shows a system 600, including an XR terminal 630, a Wi-Fi router or Wi-Fi access point 620 (which may be referred to as a Wi-Fi apparatus 620 for short), and another terminal 610. The another terminal 610 is a terminal other than the XR terminal 630, and the another terminal 610 may be an XR terminal, or may be a common terminal (which may also be referred to as a non-XR terminal). The another terminal 610 may transmit XR data to the XR terminal 630 via the Wi-Fi apparatus 620. For example, the another terminal 610 is a mobile phone device, the Wi-Fi apparatus 620 is a Wi-Fi router, a Wi-Fi access point, or a set-top box, and the XR terminal 630 is a television device, a smart display device, or an electronic tablet device. The mobile phone device may project XR data onto the television device, the smart display device, or the electronic tablet device by using the Wi-Fi router, the Wi-Fi access point, or the set-top box, and present the XR data to users.

Figure 7:
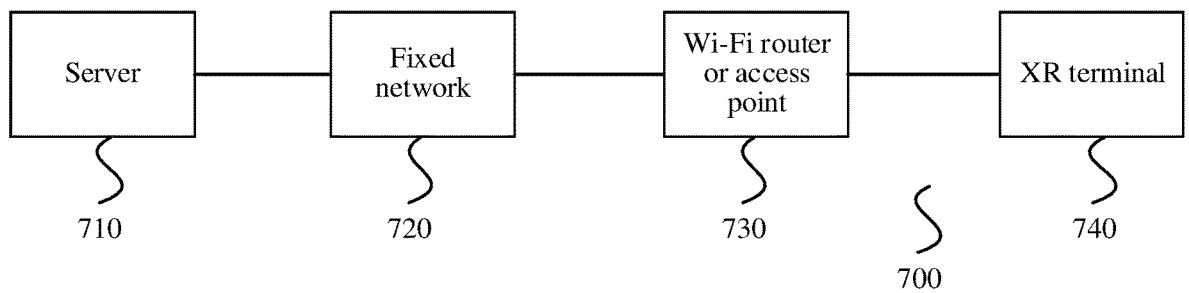

FIG. 7 is a schematic diagram of another scenario to which an embodiment of this disclosure is applicable. FIG.

7 shows a system 700, including a server 710, a fixed network 720, a Wi-Fi router or Wi-Fi access point 730 (which may be referred to as a Wi-Fi apparatus 730 for short), and an XR terminal 740 The server 710 may be configured to code, decode, and render XR source data, and transmit XR data to the XR terminal 740 via the fixed network 720 and the Wi-Fi apparatus 730. For example, the fixed network 720 is an operator network, the Wi-Fi apparatus 730 is a Wi-Fi router, a Wi-Fi access point, or a set-top box, and the server 710 transmits XR data to or projects XR data onto the XR terminal 740 via the operator network 720 and the Wi-Fi apparatus 730.

It can be understood that FIG. 4 to FIG. 7 schematically show several scenarios to which embodiments of this application are applicable, and no limitation is imposed on the scenarios to which embodiments of this application are applicable.

The following describes the technical solutions of this application in detail by using specific embodiments with reference to the accompanying drawings. The following embodiments and implementations may be combined with each other, and same or similar concepts or processes may not be described again in some embodiments. It can be understood that a function explained in this application may be implemented by using an independent hardware circuit, software running in combination with a processor/microprocessor or a general-purpose computer, an application-specific integrated circuit, and/or one or more digital signal processors. When described as a method, this application may alternatively be implemented in a computer processor and a memory coupled to the processor.

For ease of understanding of embodiments, some concepts or terms used in this disclosure are first briefly described.

1. Galois field (GF): The GF is a field including a limited quantity of elements, and GF(q) may be used to represent a GF including q elements, where q is a positive integer. For example, GF(2) includes two elements: 0 and 1 (which may also be understood as that an element in GF(2) can be represented in binary), GF(4) includes four elements: 0, 1, 2, and 3, and GF(q) includes q elements: 0, 1, . . . , and q−1.

2. Operation in the GF: In this application, if an element included in a coding matrix, a coding vector, or a coding kernel is an element in the GF, an operation related to coding may be understood as an operation in the GF.

Multiplication in the GF: An element in the GF may be generated by using a primitive polynomial P(x) in the GF. Polynomial multiplication in the GF means mapping an element in the GF to a polynomial form, mapping a multiplication operation in the GF field to polynomial multiplication, and then performing a modulo operation on the primitive polynomial P(x). For example, in the case that q=4, a primitive polynomial of GF(4) is $P(x)=x^2+x+1$, and 2-bit data (for example, "10", where a corresponding polynomial form is x) is multiplied by 2-bit data (for example, "11", where a corresponding polynomial form is x+1) in GF(4), to meet $(x*(x+1))$ mod $P(x)=(x^2+x)$ mod $(x^2+x+1)=1$ (mod represents a modulo operation), where a corresponding binary representation is "01". For another example, in the case that q=4, 4-bit data (for example, "1011") is multiplied by 2-bit data (for example, "11", where a corresponding polynomial form is x+1) in GF(4), and the first two bits "10" (corresponding to a polynomial form x) and the last two bits "11" (corresponding to a polynomial form x+1) in the 4-bit data "1011" may be separately multiplied by the 2-bit data "11" (corresponding to the polynomial form x+1) in GF(4), and then obtained results are concatenated to obtain a result of multiplying "1011" and "11" in GF(4).

In other words, $(x*(x+1))$ mod $P(x)=(x^2+x)$ mod $(x^2+x+1)=1$, where a corresponding binary representation is "01"; and $((x+1)*(x+1))$ mod $P(x)=(x^2+2x+1)$ mod $(x^2+x+1)=x$, where a corresponding binary representation is "10".

Then, "01" and "10" are concatenated to obtain a binary representation "0110" corresponding to the result of multiplying "1011" and "11" in GF(4).

Addition in the GF: Polynomial addition in the GF means mapping an element in the GF to a polynomial form, and mapping an addition operation in the GF field to polynomial addition (for example, an exclusive OR of coefficients of a same term). For example, exclusive OR addition is performed on 2-bit data (for example, "10", where a corresponding polynomial form is x) and 2-bit data (for example, "11", where a corresponding polynomial form is x+1) in the GF, to meet $x \oplus (x+1) = (x+0) \oplus (x+1) = (x \oplus x) + (0 \oplus 1) = 0+1=1$ ($\oplus$ represents exclusive OR addition), where a corresponding binary representation is "01".

Figure 8:
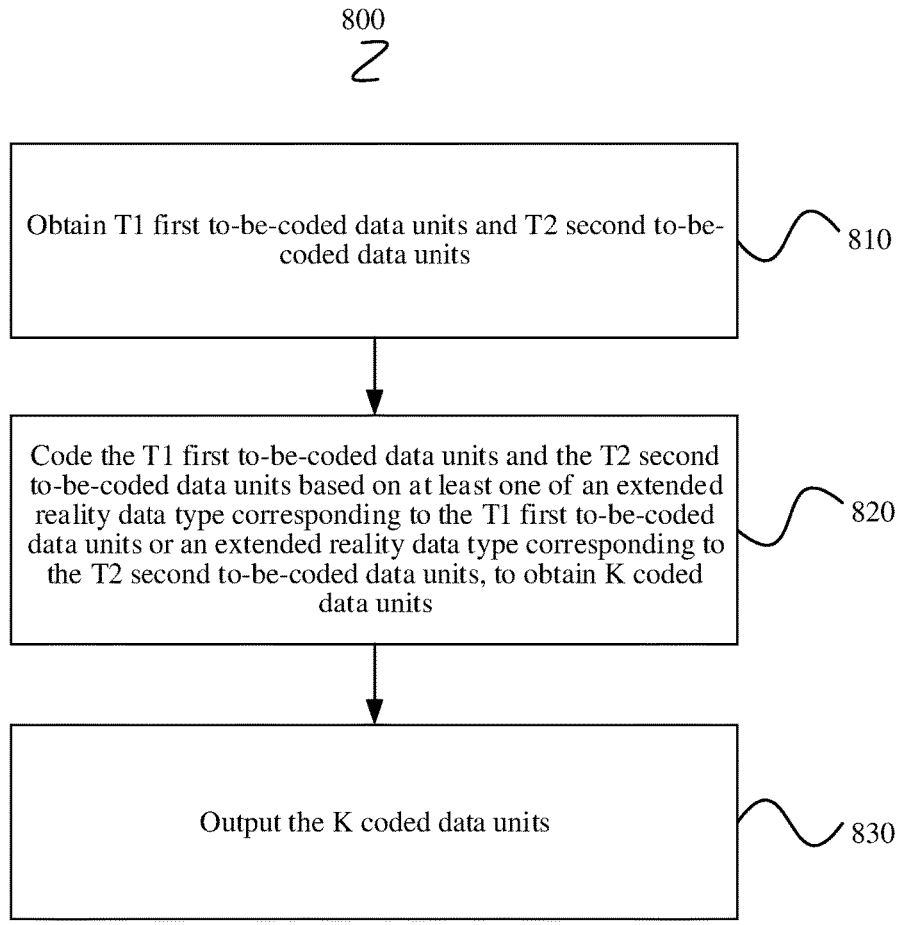
FIG. 8 is a schematic flowchart of a coding method according to an embodiment of this disclosure.

FIG. 8 is a schematic flowchart of a coding method 800 according to an embodiment of this disclosure. The method may be performed by a terminal, or may be performed by a chip, a chip system, a processor, or the like that supports the terminal in implementing the method. The method may be performed by a network device, or may be performed by a chip, a chip system, a processor, or the like that supports the network device in implementing the method. As shown in FIG. 8, the method 800 in this embodiment may include step 810, step 820, and step 830.

Step 810: Obtain T1 first to-be-coded data units and T2 second to-be-coded data units, where T1 and T2 are integers greater than or equal to 1.

Step 820: Code the T1 first to-be-coded data units and the T2 second to-be-coded data units based on at least one of an extended reality data type corresponding to the T1 first to-be-coded data units or an extended reality data type corresponding to the T2 second to-be-coded data units, to obtain K coded data units, where K is an integer greater than or equal to T1+T2.

Step 830: Output the K coded data units. When the method 800 is performed by the terminal, the outputting a coded data unit may be understood as that the terminal sends the coded data unit to a network device or another terminal. When the method 800 is performed by the network device, the outputting a coded data unit may be understood as that the network device sends the coded data unit to a terminal or another network device. The sending a coded data unit may also be understood as sending a processed coded data unit. The processing includes, for example, one or more of modulation, layer mapping, antenna port mapping, precoding, or resource mapping. When the method 800 is performed by the chip, the chip system, or the processor in the terminal or the network device, the outputting a coded data unit may be understood as outputting, to a module that subsequently processes the coded data unit, the coded data unit in the terminal or the network device through a communication interface. It can be understood that outputting in this application may mean sending a signal or data on an air interface, or may mean outputting a signal or data to another module in the apparatus through a communication interface in the apparatus.

According to the foregoing method, in a process of coding XR data, coding of the XR data can be completed based on different dimensions or different QoS requirements of the XR data, so as to improve coding efficiency of the XR data, and improve utilization efficiency of limited air interface resources.

A specific coding type is not limited in this application. For example, the coding type may be packet-based coding, convolutional coding, or random linear coding, or the coding type may be network coding (for example, packet-based network coding, convolutional network coding, or random linear network coding).

In this disclosure, there may be a plurality of different implementations of coding a to-be-coded data unit. For example, the to-be-coded data unit may be coded by using a coding matrix, or the to-be-coded data unit may be coded by using a coding kernel. The coding kernel may be understood as a coding vector. The coding kernel may also be referred to as a convolution kernel, a coding kernel vector, a coefficient vector, or the like. Optionally, the coding kernel is included in a coding matrix. For example, the coding kernel may include all non-zero elements in one row or one column of the coding matrix.

In this disclosure, the extended reality data type corresponding to the T1 first to-be-coded data units and the extended reality data type corresponding to the T2 second to-be-coded data units may have a plurality of different classifications.

In a possible implementation of the extended reality data type, the extended reality data type corresponding to the T1 first to-be-coded data units includes extended reality base layer data, and the extended reality data type corresponding to the T2 second to-be-coded data units includes extended reality enhancement layer data. Optionally, the extended reality base layer data and the extended reality enhancement layer data may be extended reality data obtained by performing source coding on XR source data, and source coding may be, for example, high efficiency video coding (HEVC) or scalability extension of HEVC (SHVC). According to this implementation, in a process of coding XR data, coding of the XR data can be completed based on requirements of different XR data types for QoS, so as to improve coding efficiency of the XR data, improve utilization efficiency of limited air interface resources, and ensure a QoS requirement of the XR data by using a limited resource with reference to coding.

In another possible implementation of the extended reality data type, the extended reality data type corresponding to the T1 first to-be-coded data units includes extended reality in-field of view (FoV) data, and the extended reality data type corresponding to the T2 second to-be-coded data units includes extended reality out-of-FoV data. Optionally, the extended reality in-FoV data and the extended reality out-of-FoV data may be extended reality data obtained by performing FoV source coding on XR source data. FoV source coding may divide the XR source data into an in-angle-of-view part and an out-of-angle-of-view part. Generally, an angle of view of an FoV is approximately 60 to 150 degrees. The in-angle-of-view part corresponds to the extended reality in-FoV data, and the out-of-angle-of-view part corresponds to the extended reality out-of-FoV data. According to this implementation, in a process of coding XR data, coding of the XR data can be completed based on a visual presentation requirement of the XR data, so as to improve coding efficiency of the XR data, improve utilization efficiency of limited air interface resources, and improve visual experience of users on an XR service by using a limited resource with reference to coding.

In another possible implementation of the extended reality data type, the extended reality data type corresponding to the T1 first to-be-coded data units includes video data, and the extended reality data type corresponding to the T2 second to-be-coded data units includes data (for example, audio data) other than the video data type. According to this implementation, in a process of coding XR data, coding of the XR data can be completed based on a visual presentation requirement and another user awareness (for example, auditory) presentation requirement of the XR data, so as to improve coding efficiency of the XR data, improve utilization efficiency of limited air interface resources, and improve integrated experience of users on an XR service by using a limited resource with reference to coding.

It can be understood that, in this disclosure, two extended reality data types are used as examples to describe the implementation solution. A quantity of extended reality data types is not limited herein. For example, there may be three or more extended reality data types. Correspondingly, an example in which the T1 first to-be-coded data units and the T2 second to-be-coded data units are two types of to-be-coded data units is used to describe the implementation solution. A quantity of types of to-be-coded data units is not limited in this application either. For example, the method 800 may further include T3 third to-be-coded data units corresponding to another extended reality data type, where T3 is an integer greater than or equal to 1.

In step 820, there may be a plurality of different implementations of coding the T1 first to-be-coded data units and the T2 second to-be-coded data units based on at least one of an extended reality data type corresponding to the T1 first to-be-coded data units or an extended reality data type corresponding to the T2 second to-be-coded data units.

In a possible implementation of step 820, a coding matrix H is obtained based on the least one of the extended reality data type corresponding to the T1 first to-be-coded data units or the extended reality data type corresponding to the T2 second to-be-coded data units; and the T1 first to-be-coded data units and the T2 second to-be-coded data units are coded based on the coding matrix H.

Optionally, the coding matrix H includes a coding submatrix $\tilde{H}$, the coding submatrix $\tilde{H}$ includes T1 first coding vectors and T2 second coding vectors, the T1 first coding vectors respectively correspond to the T1 first to-be-coded data units, and the T2 second coding vectors respectively correspond to the T2 second to-be-coded data units.

In an implementation of obtaining K coded data units, the T1 first to-be-coded data units $O_1, O_2, \ldots, O_{T1}$ and the T2 second to-be-coded data units $Q_1, Q_2, \ldots, Q_{T2}$ are coded based on the coding matrix H, to obtain the K coded data units $A_1, A_2, \ldots, A_K$, where K is greater than or equal to T1+T2, and the K coded data units meet:

$$[A_1, A_2, \ldots, A_K] = [O_1, Q_1, O_2, Q_2, \ldots, O_{T1} Q_{T2}] \times H$$

A dimension of the coding matrix H is (T1+T2)*K, that is, the coding matrix H includes T1+T2 rows and K columns. H includes an element in GF(q), and q is an integer greater than 0. In addition, H includes at least one submatrix $\tilde{H}$, and the submatrix $\tilde{H}$ includes T1+T2 rows. T1 row vectors in the submatrix $\tilde{H}$ correspond to the T1 first coding vectors, and the other T2 row vectors in the submatrix $\tilde{H}$ correspond to the T2 second coding vectors. A non-zero element in GF(q) exists on a diagonal in the submatrix $\tilde{H}$. Optionally, a quantity of diagonals is M, and M is an integer greater than 0 and less than or equal to T1+T2. In the case that the submatrix $\tilde{H}$ is a square matrix, the diagonal includes a main diagonal of the square matrix and a diagonal parallel to the main diagonal. M may be understood as a convolution depth, a coding constraint degree, a constraint length, a convolution constraint length, a memory depth, a coding depth, a coding kernel size, a coding kernel length, or a coding kernel depth corresponding to coding, and a value of M may be understood as a maximum value of a quantity of to-be-coded data units that participate in coding when one coded data unit is obtained.

It can be understood that values of T1 and T2 and a sequence of arranging the T1 first to-be-coded data units $O_1, O_2, \ldots, O_{T1}$ and the T2 second to-be-coded data units $Q_1, Q_2, \ldots, Q_{T2}$ are not limited in this application. In this example of this application, an example in which T1 is equal to T2, and the T1 first to-be-coded data units $O_1, O_2, \ldots, O_{T1}$ and the T2 second to-be-coded data units $Q_1, Q_2, \ldots, Q_{T2}$ are alternately arranged is used to describe a specific implementation method of the solution of this application. A case in which values of T1 and T2 are different, and the T1 first to-be-coded data units and the T2 second to-be-coded data units are arranged in another sequence is not provided in the example of this application, but still falls within the protection scope of this application.

In a possible implementation of the coding matrix H, the coding matrix H meets:

$$H = [H_{left}^{(T1+T2) \times (T1+T2)} H_{right}^{(T1+T2) \times (K-T1-T2)}] = H_1$$

Herein, $H_{left}^{(T1+T2) \times (T1+T2)}$ may be understood as the foregoing coding submatrix $\tilde{H}$. Non-zero elements in GF(q) exist on a main diagonal of $H_{left}^{(T1+T2) \times (T1+T2)}$ and M−1 diagonals parallel to the main diagonal. For example, $H_{left}^{(T1+T2) \times (T1+T2)}$ meets a form shown in Table 1.

TABLE 1

| $h_1^{(1)}$ | $h_2^{(1)}$ | ... | $h_M^{(1)}$ | 0 | 0 | 0 | 0 | 0 |
|---|---|---|---|---|---|---|---|---|
| 0 | $h_1^{(2)}$ | $h_2^{(2)}$ | ... | $h_M^{(2)}$ | 0 | 0 | 0 | 0 |
| 0 | 0 | ⋱ | ⋱ | ⋱ | ⋱ | 0 | 0 | 0 |
| 0 | 0 | 0 | $h_1^{(n)}$ | $h_2^{(n)}$ | ... | $h_M^{(n)}$ | 0 | 0 |
| 0 | 0 | 0 | 0 | ⋱ | ⋱ | ⋱ | ⋱ | 0 |
| 0 | 0 | 0 | 0 | 0 | $h_1^{(T1+T2-M+1)}$ | $h_2^{(T1+T2-M+1)}$ | ... | $h_M^{(T1+T2-M+1)}$ |
| 0 | 0 | 0 | 0 | 0 | 0 | $h_1^{(T1+T2-M+2)}$ | $h_2^{(T1+T2-M+2)}$ ... | $h_{M-1}^{(T1+T2-M+2)}$ |
| 0 | 0 | 0 | 0 | 0 | 0 | ⋱ | ⋱ | . |
| | | | | | | | | . |
| | | | | | | | | . |
| 0 | 0 | 0 | 0 | 0 | 0 | 0 | $h_1^{(T1+T2-1)}$ | $h_2^{(T1+T2-1)}$ |
| 0 | 0 | 0 | 0 | 0 | 0 | 0 | 0 | $h_1^{(T1+T2)}$ |

In the foregoing example, elements on the main diagonal of $H_{left}^{(T1+T2) \times (T1+T2)}$ and the M−1 diagonals parallel to the main diagonal may be abbreviated as $\{h_i^{(1)}, h_i^{(2)}, \ldots h_i^{(T1+T2-i+1)}\}$, $1 \leq i \leq M$. When i=1, $\{h_i^{(1)}, h_i^{(2)}, \ldots h_i^{(T1+T2-i+1)}\}$ represents the elements on the main diagonal. When i=2, ... M, $\{h_i^{(1)}, h_i^{(2)}, \ldots h_i^{(T1+T2-i+1)}\}$ represents the elements on the M−1 diagonals parallel to the main diagonal. For any $1 \leq i \leq M$, at least one non-zero element in GF(q) exists in $\{h_i^{(1)}, h_i^{(2)}, \ldots h_i^{(T1+T2-i+1)}\}$. In addition, for any $1 \leq i \leq M$, values of T1+T2−i+1 elements in $\{h_i^{(1)}, h_i^{(2)}, \ldots h_i^{(T1+T2-i+1)}\}$ may be the same, or may be partially different, or may be completely different. For any $1 \leq i \leq M$, when the values of the T1+T2−i+1 elements in $\{h_i^{(1)}, h_i^{(2)}, \ldots, h_i^{(T1+T2-i+1)}\}$ are the same, $H_{left}^{(T1+T2) \times (T1+T2)}$ is an upper triangular Toeplitz (Toeplitz) matrix. In this example, there is no special requirement on the submatrix $H_{right}^{(T1+T2) \times (K-T1-T2)}$ included in $H_1$. For example, an element in $H_{right}^{(T1+T2) \times (K-T1-T2)}$ may be randomly obtained from GF(q).

A total of T1 row vectors in the first row, the third row, ..., and the $(T1+T2-1)^{th}$ row in the submatrix $H_{left}^{(T1+T2) \times (T1+T2)}$ shown in Table 1 are the T1 first coding vectors, and respectively correspond to the T1 first to-be-coded data units $O_1, O_2, \ldots, O_{T1}$. A total of T2 row vectors in the second row, the fourth row, ..., and the $(T1+T2)^{th}$ row in the submatrix $H_{left}^{(T1+T2) \times (T1+T2)}$ are the T2 second coding vectors, and respectively correspond to the T2 second to-be-coded data units $Q_1, Q_2, \ldots, Q_{T2}$.

In another possible implementation of the coding matrix H, the coding matrix H meets:

$$H = [H_{left}^{(T1+T2) \times (T1+T2+M-1)} H_{right}^{(T1+T2) \times (K-T1-T2-M+1)}] = H_2$$

Herein, $H_{left}^{(T1+T2) \times (T1+T2+M-1)}$ may be understood as the foregoing coding submatrix $\tilde{H}$. Non-zero elements in GF(q) exist on M diagonals of $H_{left}^{(T1+T2) \times (T1+T2+M-1)}$. For example, $H_{left}^{(T1+T2) \times (T1+T2+M-1)}$ meets a form shown in Table 2.

TABLE 2

| $h_1^{(1)}$ | $h_2^{(1)}$ | ... | $h_M^{(1)}$ | 0 | 0 | 0 | 0 | 0 | 0 | 0 | 0 |
|---|---|---|---|---|---|---|---|---|---|---|---|
| 0 | $h_1^{(2)}$ | $h_2^{(2)}$ | ... | $h_M^{(2)}$ | 0 | 0 | 0 | 0 | 0 | 0 | 0 |
| 0 | 0 | ⋱ | ⋱ | ⋱ | ⋱ | 0 | 0 | 0 | 0 | 0 | 0 |
| 0 | 0 | 0 | $h_1^{(n)}$ | $h_2^{(n)}$ | ... | $h_M^{(n)}$ | 0 | 0 | 0 | 0 | 0 |
| 0 | 0 | 0 | 0 | ⋱ | ⋱ | ⋱ | ⋱ | 0 | 0 | 0 | 0 |
| 0 | 0 | 0 | 0 | 0 | $h_1^{(T1+T2-M+1)}$ | $h_2^{(T1+T2-M+1)}$ | ... | $h_M^{(T1+T2-M+1)}$ | 0 | 0 | 0 |
| 0 | 0 | 0 | 0 | 0 | 0 | $h_1^{(T1+T2-M+2)}$ | $h_2(T1+T2-M+2)$ ... | $h_{M-1}^{(T1+T2-M+2)}$ | $h_M^{(T1+T2-M+2)}$ | 0 | 0 |
| 0 | 0 | 0 | 0 | 0 | 0 | ⋱ | ⋱ | ⋱ | ⋱ | 0 | 0 |
| 0 | 0 | 0 | 0 | 0 | 0 | $h_1^{(T1+T2-1)}$ | $h_2^{(T1+T2-1)}$ | ... | $h_M^{(T1+T2-1)}$ | 0 |
| 0 | 0 | 0 | 0 | 0 | 0 | 0 | $h_1^{(T1+T2)}$ | $h_2^{(T1+T2)}$ | ... | $h_M^{(T1+T2)}$ |

In the foregoing example, an element on the diagonal in $H_{left}^{(T1+T2)\times(T1+T2+M-1)}$ may be abbreviated as $\{h_i^{(1)}, h_i^{(2)}, \ldots, h_i^{(T1+T2)}\}$, $1 \leq i \leq M$. For any $1 \leq i \leq M$, at least one non-zero element in GF(q) exists in $\{h_i^{(1)}, h_i^{(2)}, \ldots, h_i^{(T1+T2)}\}$. In addition, for any $1 \leq i \leq M$, values of T1+T2 elements in $\{h_i^{(1)}, h_i^{(2)}, \ldots, h_i^{(T1+T2)}\}$ may be the same, or may be partially different, or may be completely different. In this example, there is no special requirement on the submatrix $H_{right}^{(T1+T2)\times(K-T1-T2-M+1)}$ included in $H_2$. For example, an element in $H_{right}^{(T1+T2)\times(K-T1-T2-M+1)}$ may be randomly obtained from GF(q).

For another example, $H_{left}^{(T1+T2)\times(T1+T2+M-1)}$ meets a form shown in Table 3.

includes one or more column vectors in $H_1$, or the matrix H' includes one or more column vectors in $H_2$.

In the several possible coding matrices provided above, the T1 first coding vectors and the T2 second coding vectors may have a plurality of different designs.

In a possible implementation of the first coding vector and the second coding vector, a quantity of non-zero coefficients included in any one of the T1 first coding vectors is greater than a quantity of non-zero coefficients included in any one of the T2 second coding vectors. Optionally, the quantity of non-zero coefficients included in the any one of the T2 second coding vectors is less than a coding depth M.

TABLE 3

| $h_1^{(1)}$ | $h_2^{(1)}$ | ... | $h_M^{(1)}$ | 0 | 0 | 0 | 0 | 0 | $h_1^{(T1+T2+1)}$ | ... | $h_{M-1}^{(T1+T2+1)}$ |
|---|---|---|---|---|---|---|---|---|---|---|---|
| 0 | $h_1^{(2)}$ | $h_2^{(2)}$ | ... | $h_M^{(2)}$ | 0 | 0 | 0 | 0 | 0 | ⋱ | . |
| | | | | | | | | | | | . |
| | | | | | | | | | | | . |
| 0 | 0 | ⋱ | ⋱ | ⋱ | ⋱ | 0 | 0 | 0 | 0 | 0 | $h_1^{(T1+T2+M-1)}$ |
| 0 | 0 | 0 | $h_1^{(n)}$ | $h_2^{(n)}$ | ... | $h_M^{(n)}$ | 0 | 0 | 0 | 0 | 0 |
| 0 | 0 | 0 | 0 | #z,36, | ⋱ | ⋱ | ⋱ | 0 | 0 | 0 | 0 |
| 0 | 0 | 0 | 0 | 0 | $h_1^{(T1+T2-M+1)}$ | $h_2^{(T1+T2-M+1)}$ | ... | $h_M^{(T1+T2-M+1)}$ | 0 | 0 | 0 |
| 0 | 0 | 0 | 0 | 0 | 0 | $h_1^{(T1+T2-M+2)}$ | $h_2^{(T1+T2-M+2)}$ ... | $h_{M-1}^{(T1+T2-M+2)}$ | $h_M^{(T1+T2-M+2)}$ | 0 | 0 |
| 0 | 0 | 0 | 0 | 0 | #z,36, | ⋱ | ⋱ | ⋱ | ⋱ | 0 | 0 |
| 0 | 0 | 0 | 0 | 0 | 0 | $h_1^{(T1+T2-1)}$ | $h_2^{(T1+T2-1)}$ | ... | $h_M^{(T1+T2-1)}$ | 0 |
| 0 | 0 | 0 | 0 | 0 | 0 | 0 | $h_1^{(T1+T2)}$ | $h_2^{(T1+T2)}$ | ... | $h_M^{(T1+T2)}$ |

In the foregoing example, at least one non-zero element in GF(q) exists on a diagonal in $H_{left}^{(T1+T2)\times(T1+T2+M-1)}$. In addition, values of elements on any diagonal may be the same, or may be partially different, or may be completely different. In this example, there is no special requirement on the submatrix $H_{right}^{(T1+T2)\times(K-T1-T2-M+1)}$ included in $H_2$. For example, an element in $H_{right}^{(T1+T2)\times(K-T1-T2-M+1)}$ may be randomly obtained from GF(q).

A total of T1 row vectors in the first row, the third row, ..., and the $(T1+T2-1)^{th}$ row in the submatrix $H_{left}^{(T1+T2)\times(T1+T2+M-1)}$ shown in Table 2 or Table 3 are the T1 first coding vectors, and left respectively correspond to the T1 first to-be-coded data units $O_1, O_2, \ldots, O_{T1}$. A total of T2 row vectors in the second row, the fourth row, ..., and the $(T1+T2)^{th}$ row in the submatrix $H_{left}^{(T1+T2)\times(T1+T2+M-1)}$ are the T2 second coding vectors, and respectively correspond to the T2 second to-be-coded data units $Q_1, Q_2, \ldots, Q_{T2}$.

In another possible implementation of the coding matrix H, the coding matrix H meets:

$$H=[I_{T1+T2}H']=H_3$$

Herein, $I_{T1+T2}$ is an identity matrix of $(T1+T2)*(T1+T2)$ dimensions. The matrix H' is $H_1$ or $H_2$, or the matrix H'

For example, when the foregoing coding matrix $H_1$ is used, a quantity of non-zero coefficients included in any one of the T1 first coding vectors (namely, a total of T1 row vectors in the first row, the third row, ..., and the $(T1+T2-1)^{th}$ row) in the submatrix $H_{left}^{(T1+T2)\times(T1+T2+M-1)}$ is greater than a quantity of non-zero coefficients included in any one of the T2 second coding vectors (namely, a total of T2 row vectors in the second row, the fourth row, ..., and the $(T1+T2)^{th}$ row).

For another example, when the foregoing coding matrix $H_2$ is used, a quantity of non-zero coefficients included in any one of the T1 first coding vectors (namely, a total of T1 row vectors in the first row, the third row, ..., and the $(T1+T2-1)^{th}$ row) in the submatrix $H_{left}^{(T1+T2)\times(T1+T2+M-1)}$ is greater than a quantity of non-zero coefficients included in any one of the T2 second coding vectors (namely, a total of T2 row vectors in the second row, the fourth row, ..., and the $(T1+T2)^{th}$ row).

An example in which T1=T2=3, K=8, and the coding depth M is 4 is used to describe an implementation of the first coding vector and the second coding vector.

When the coding matrix $H_1$ is used, the submatrix $H_{left}^{(T1+T2)\times(T1+T2)}=H_{left}^{6\times6}$ in $H_1$ may have, for example, a form shown in Table 4, Table 5, or Table 6, where "0" represents a zero coefficient in the submatrix, and another element represents a non-zero coefficient in the submatrix.

TABLE 4

| $h_1^{(1)}$ | $h_2^{(1)}$ | $h_3^{(1)}$ | $h_4^{(1)}$ | 0 | 0 |
|---|---|---|---|---|---|
| 0 | $h_1^{(2)}$ | 0 | 0 | 0 | 0 |
| 0 | 0 | $h_1^{(3)}$ | $h_2^{(3)}$ | $h_3^{(3)}$ | $h_4^{(3)}$ |
| 0 | 0 | 0 | $h_1^{(4)}$ | 0 | 0 |
| 0 | 0 | 0 | 0 | $h_1^{(5)}$ | $h_2^{(5)}$ |
| 0 | 0 | 0 | 0 | 0 | $h_1^{(6)}$ |

TABLE 5

| $h_1^{(1)}$ | $h_2^{(1)}$ | $h_3^{(1)}$ | $h_4^{(1)}$ | 0 | 0 |
|---|---|---|---|---|---|
| 0 | 0 | $h_1^{(2)}$ | 0 | 0 | 0 |
| 0 | 0 | $h_1^{(3)}$ | $h_2^{(3)}$ | $h_3^{(3)}$ | $h_4^{(3)}$ |
| 0 | 0 | 0 | 0 | $h_1^{(4)}$ | 0 |
| 0 | 0 | 0 | 0 | $h_1^{(5)}$ | $h_2^{(5)}$ |
| 0 | 0 | 0 | 0 | 0 | $h_1^{(6)}$ |

TABLE 6

| $h_1^{(1)}$ | $h_2^{(1)}$ | $h_3^{(1)}$ | 0 | 0 | 0 |
|---|---|---|---|---|---|
| 0 | $h_1^{(2)}$ | 0 | 0 | 0 | 0 |
| 0 | 0 | $h_1^{(3)}$ | $h_2^{(3)}$ | $h_3^{(3)}$ | 0 |
| 0 | 0 | 0 | $h_1^{(4)}$ | 0 | 0 |
| 0 | 0 | 0 | 0 | $h_1^{(5)}$ | $h_2^{(5)}$ |
| 0 | 0 | 0 | 0 | 0 | $h_1^{(6)}$ |

When the coding matrix $H_2$ is used, and the submatrix $H_{left}^{(T1+T2)\times(T1+T2+M-1)}$ in $H_2$ uses the form shown in Table 2, submatrix $H_{left}^{(T1+T2)\times(T1+T2+M-1)}$=submatrix $H_{left}^{6\times 9}$ may have, for example, a form shown in Table 7, Table 8, or Table 9, where "0" represents a zero coefficient in the submatrix, and another element represents a non-zero coefficient in the submatrix.

TABLE 7

| $h_1^{(1)}$ | $h_2^{(1)}$ | $h_3^{(1)}$ | $h_4^{(1)}$ | 0 | 0 | 0 | 0 | 0 |
|---|---|---|---|---|---|---|---|---|
| 0 | $h_1^{(2)}$ | 0 | 0 | 0 | 0 | 0 | 0 | 0 |
| 0 | 0 | $h_1^{(3)}$ | $h_2^{(3)}$ | $h_3^{(3)}$ | $h_4^{(3)}$ | 0 | 0 | 0 |
| 0 | 0 | 0 | $h_1^{(4)}$ | 0 | 0 | 0 | 0 | 0 |
| 0 | 0 | 0 | 0 | $h_1^{(5)}$ | $h_2^{(5)}$ | $h_3^{(5)}$ | $h_4^{(5)}$ | 0 |
| 0 | 0 | 0 | 0 | 0 | $h_1^{(6)}$ | 0 | 0 | 0 |

TABLE 8

| $h_1^{(1)}$ | $h_2^{(1)}$ | $h_3^{(1)}$ | $h_4^{(1)}$ | 0 | 0 | 0 | 0 | 0 |
|---|---|---|---|---|---|---|---|---|
| 0 | 0 | $h_1^{(2)}$ | 0 | 0 | 0 | 0 | 0 | 0 |
| 0 | 0 | $h_1^{(3)}$ | $h_2^{(3)}$ | $h_3^{(3)}$ | $h_4^{(3)}$ | 0 | 0 | 0 |
| 0 | 0 | 0 | 0 | $h_1^{(4)}$ | 0 | 0 | 0 | 0 |
| 0 | 0 | 0 | 0 | $h_1^{(5)}$ | $h_2^{(5)}$ | $h_3^{(5)}$ | $h_4^{(5)}$ | 0 |
| 0 | 0 | 0 | 0 | 0 | 0 | $h_1^{(6)}$ | 0 | 0 |

TABLE 9

| $h_1^{(1)}$ | $h_2^{(1)}$ | $h_3^{(1)}$ | 0 | 0 | 0 | 0 | 0 | 0 |
|---|---|---|---|---|---|---|---|---|
| 0 | $h_1^{(2)}$ | 0 | 0 | 0 | 0 | 0 | 0 | 0 |
| 0 | 0 | $h_1^{(3)}$ | $h_2^{(3)}$ | $h_3^{(3)}$ | 0 | 0 | 0 | 0 |
| 0 | 0 | 0 | $h_1^{(4)}$ | 0 | 0 | 0 | 0 | 0 |
| 0 | 0 | 0 | 0 | $h_1^{(5)}$ | 0 | $h_3^{(5)}$ | $h_4^{(5)}$ | 0 |
| 0 | 0 | 0 | 0 | 0 | $h_1^{(6)}$ | 0 | 0 | 0 |

When the coding matrix $H_2$ is used, and the submatrix $H_{left}^{(T1+T2)\times(T1+T2+M-1)}$ in $H_2$ uses the form shown in Table 3, submatrix $H_{left}^{(T1+T2)\times(T1+T2+M-1)}$=submatrix $H_{left}^{6\times 9}$ may have, for example, a form shown in Table 10, Table 11, or Table 12, where "0" represents a zero coefficient in the submatrix, and another element represents a non-zero coefficient in the submatrix.

TABLE 10

| $h_1^{(1)}$ | $h_2^{(1)}$ | $h_3^{(1)}$ | $h_4^{(1)}$ | 0 | 0 | $h_1^{(7)}$ | $h_2^{(7)}$ | $h_3^{(7)}$ |
|---|---|---|---|---|---|---|---|---|
| 0 | $h_1^{(2)}$ | 0 | 0 | 0 | 0 | 0 | 0 | 0 |
| 0 | 0 | $h_1^{(3)}$ | $h_2^{(3)}$ | $h_3^{(3)}$ | $h_4^{(3)}$ | 0 | 0 | $h_1^{(9)}$ |
| 0 | 0 | 0 | $h_1^{(4)}$ | 0 | 0 | 0 | 0 | 0 |
| 0 | 0 | 0 | 0 | $h_1^{(5)}$ | $h_2^{(5)}$ | $h_3^{(5)}$ | $h_4^{(5)}$ | 0 |
| 0 | 0 | 0 | 0 | 0 | $h_1^{(6)}$ | 0 | 0 | 0 |

TABLE 11

| $h_1^{(1)}$ | $h_2^{(1)}$ | $h_3^{(1)}$ | $h_4^{(1)}$ | 0 | 0 | $h_1^{(7)}$ | $h_2^{(7)}$ | $h_3^{(7)}$ |
|---|---|---|---|---|---|---|---|---|
| 0 | 0 | $h_1^{(2)}$ | 0 | 0 | 0 | 0 | 0 | 0 |
| 0 | 0 | $h_1^{(3)}$ | $h_2^{(3)}$ | $h_3^{(3)}$ | $h_4^{(3)}$ | 0 | 0 | $h_1^{(9)}$ |
| 0 | 0 | 0 | 0 | $h_1^{(4)}$ | 0 | 0 | 0 | 0 |
| 0 | 0 | 0 | 0 | $h_1^{(5)}$ | $h_2^{(5)}$ | $h_3^{(5)}$ | $h_4^{(5)}$ | 0 |
| 0 | 0 | 0 | 0 | 0 | 0 | $h_1^{(6)}$ | 0 | 0 |

TABLE 12

| $h_1^{(1)}$ | $h_2^{(1)}$ | $h_3^{(1)}$ | 0 | 0 | 0 | $h_1^{(7)}$ | $h_2^{(7)}$ | $h_3^{(7)}$ |
|---|---|---|---|---|---|---|---|---|
| 0 | $h_1^{(2)}$ | 0 | 0 | 0 | 0 | 0 | 0 | 0 |
| 0 | 0 | $h_1^{(3)}$ | $h_2^{(3)}$ | $h_3^{(3)}$ | 0 | 0 | 0 | $h_1^{(9)}$ |
| 0 | 0 | 0 | $h_1^{(4)}$ | 0 | 0 | 0 | 0 | 0 |
| 0 | 0 | 0 | 0 | $h_1^{(5)}$ | $h_2^{(5)}$ | $h_3^{(5)}$ | 0 | 0 |
| 0 | 0 | 0 | 0 | 0 | $h_1^{(6)}$ | 0 | 0 | 0 |

It can be understood that Table 4 to Table 12 show specific forms of several possible coding submatrices. A submatrix that meets the condition "a quantity of non-zero coefficients included in any one of the T1 first coding vectors is greater than a quantity of non-zero coefficients included in any one of the T2 second coding vectors" also falls within the protection scope of this application.

In another possible implementation of the first coding vector and the second coding vector, a quantity of non-zero coefficients included in one of the T1 first coding vectors is greater than a quantity of non-zero coefficients included in one of the T2 second coding vectors. Optionally, the quantity of non-zero coefficients included in the any one of the T2 second coding vectors is less than a coding depth M.

For example, when the foregoing coding matrix $H_1$ is used, a quantity of non-zero coefficients included in one of the T1 first coding vectors (namely, a total of T1 row vectors in the first row, the third row, ..., and the $(T1+T2-1)^{th}$ row) in the submatrix $H_{left}^{(T1+T2)\times(T1+T2)}$ is greater than a quantity of non-zero coefficients included in one of the T2 second coding vectors (namely, a total of T2 row vectors in the second row, the fourth row, ..., and the $(T1+T2)^{th}$ row).

For another example, when the foregoing coding matrix $H_2$ is used, a quantity of non-zero coefficients included in one of the T1 first coding vectors (namely, a total of T1 row vectors in the first row, the third row, ..., and the $(T1+T2-1)^{th}$ row) in the submatrix $H_{left}^{(T1+T2)\times(T1+T2+M-1)}$ greater than a quantity of non-zero coefficients included in one of the T2 second coding vectors (namely, a total of T2 row vectors in the second row, the fourth row, ..., and the $(T1+T2)^{th}$ row).

According to the foregoing implementations of the coding vectors, coding protection stronger than that of the second to-be-coded data unit can be provided for the first to-be-coded data unit based on the extended reality data type corresponding to the first to-be-coded data unit and the extended reality data type corresponding to the second to-be-coded data unit.

For example, when the extended reality data type corresponding to the T1 first to-be-coded data units includes the extended reality base layer data, and the extended reality data type corresponding to the T2 second to-be-coded data units includes the extended reality enhancement layer data, because the extended reality base layer data can provide basic extended reality experience for users, preferentially providing stronger coding protection for the extended reality base layer data can ensure basic extended reality experience of users. On this basis, providing coding protection for the extended reality enhancement layer data as much as possible can provide enhanced extended reality experience for users.

For another example, when the extended reality data type corresponding to the T1 first to-be-coded data units includes the extended reality in-FoV data, and the extended reality data type corresponding to the T2 second to-be-coded data units includes the extended reality out-of-FoV data, because the extended reality in-FoV data can present, to users, extended reality visual content that is more concerned by users than the extended reality out-of-FoV data, preferentially providing stronger coding protection for the extended reality in-FoV data can preferentially ensure extended reality experience of users.

In correspondence to the method provided in the foregoing method embodiment, an embodiment of this disclosure further provides a corresponding apparatus. The apparatus includes a corresponding module configured to perform the foregoing embodiment. The module may be software, hardware, or a combination of software and hardware.

Figure 9:
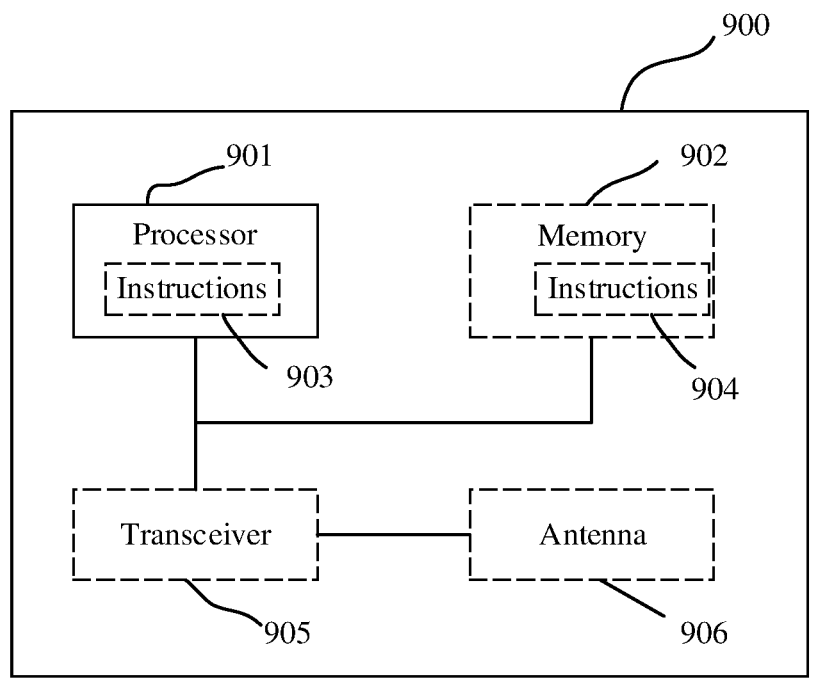
FIG. 9 is a schematic diagram of a structure of a communication apparatus according to an embodiment of this disclosure.

FIG. 9 is a schematic diagram of a structure of an apparatus. The apparatus 900 may be a network device, or may be a terminal device, or may be a chip, a chip system, a processor, or the like that supports the network device in implementing the foregoing method, or may be a chip, a chip system, a processor, or the like that supports the terminal device in implementing the foregoing method. The apparatus may be configured to implement the method described in the foregoing method embodiment. For details, refer to the descriptions in the foregoing method embodiment.

The apparatus 900 may include one or more processors 901. The processor 901 may also be referred to as a processing unit, and may implement a control function. The processor 901 may be a general-purpose processor, a dedicated processor, or the like. For example, the processor may be a baseband processor or a central processing unit. The baseband processor may be configured to process a communication protocol and communication data. The central processing unit may be configured to: control a communication apparatus (for example, a base station, a baseband chip, a terminal, a terminal chip, a DU, or a CU), execute a software program, and process data of the software program.

In an optional design, the processor 901 may also store instructions and/or data 903, and the instructions and/or data 903 may be run by the processor, so that the apparatus 900 performs the method in the foregoing method embodiment.

In another optional design, the processor 901 may include a transceiver unit configured to implement receiving and sending functions. For example, the transceiver unit may be a transceiver circuit, an interface, or an interface circuit. The transceiver circuit, the interface, or the interface circuit configured to implement the receiving and sending functions may be separated, or may be integrated together. The transceiver circuit, the interface, or the interface circuit may be configured to read and write code/data. Alternatively, the transceiver circuit, the interface, or the interface circuit may be configured to transmit or transfer a signal.

In still another possible design, the apparatus 900 may include a circuit, and the circuit may implement a sending, receiving, or communication function in the foregoing method embodiment.

Optionally, the apparatus 900 may include one or more memories 902, the one or more memories may store instructions 904, and the instructions may be run by the processor, so that the apparatus 900 performs the method in the foregoing method embodiment. Optionally, the memory may further store data. Optionally, the processor may also store instructions and/or data. The processor and the memory may be separately disposed, or may be integrated together. For example, the correspondence described in the foregoing method embodiment may be stored in the memory or the processor.

Optionally, the apparatus 900 may further include a transceiver 905 and/or an antenna 906. The processor 901 may be referred to as a processing unit, and controls the apparatus 900. The transceiver 905 may be referred to as a transceiver unit, a transceiver machine, a transceiver circuit, a transceiver apparatus, a transceiver module, or the like, and is configured to implement a transceiver function.

Optionally, the apparatus 900 in this embodiment of this disclosure may be configured to perform the method described in FIG. 8.

The processor and the transceiver described in this application may be implemented in an integrated circuit (IC), an analog IC, a radio frequency integrated circuit RFIC, a mixed signal IC, an application-specific integrated circuit (ASIC), a printed circuit board (PCB), an electronic device, or the like. The processor and the transceiver may alternatively be manufactured by using various IC technologies, for example, a complementary metal oxide semiconductor (CMOS), an N-channel metal oxide semiconductor (NMOS), a p-channel metal oxide semiconductor (PMOS), a bipolar junction transistor (BJT), a bipolar CMOS (BiCMOS), silicon germanium (SiGe), and gallium arsenide (GaAs).

The apparatus described in the foregoing embodiment may be a network device or a terminal device. However, the apparatus described in this disclosure is not limited thereto, and a structure of the apparatus may be not limited to FIG. 9. The apparatus may be an independent device, or may be a part of a relatively large device. For example, the apparatus may be:

(1) an independent integrated circuit IC, a chip, or a chip system or subsystem;
(2) a set of one or more ICs, where optionally, the IC set may also include a storage component configured to store data and/or instructions;
(3) an ASIC, for example, a modem (MSM);
(4) a module that can be embedded in another device;
(5) a receiver, a terminal, an intelligent terminal, a cellular phone, a wireless device, a handheld device, a mobile unit, a vehicle-mounted device, a network device, a cloud device, an artificial intelligence device, a machine device, a home device, a medical device, an industrial device, or the like; or
(6) others.

Figure 10:
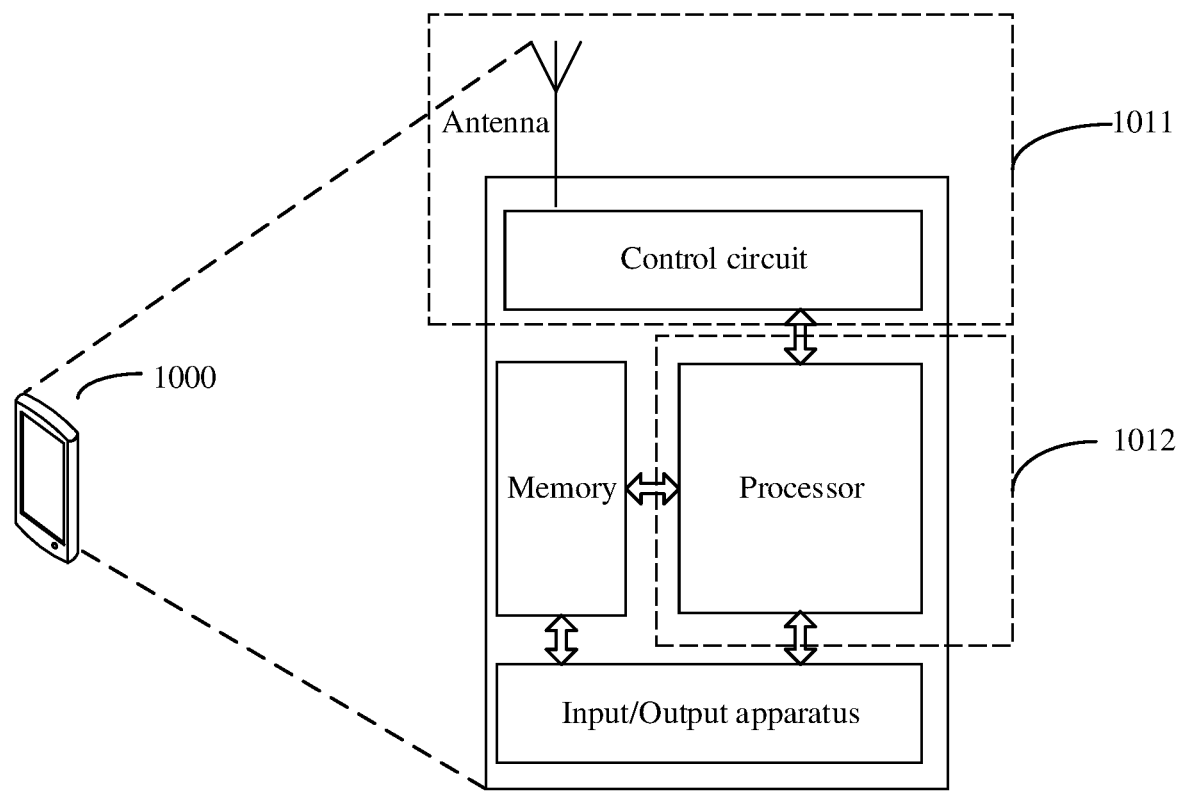
FIG. 10 is a schematic diagram of a structure of a terminal according to an embodiment of this disclosure.

FIG. 10 is a schematic diagram of a structure of a terminal device. The terminal device may be used in the scenario shown in FIG. 1, FIG. 4, FIG. 5, FIG. 6, or FIG. 7. For ease of description, FIG. 10 shows main components of the terminal device. As shown in FIG. 10, the terminal device 1000 includes a processor, a memory, a control circuit, an antenna, and an input/output apparatus. The processor is mainly configured to: process a communication protocol and communication data, control the entire terminal, execute a software program, and process data of the software program. The memory is mainly configured to store the software program and data. The radio frequency circuit is mainly configured to: perform conversion between a baseband signal and a radio frequency signal, and process the radio frequency signal. The antenna is mainly configured to receive and send a radio frequency signal in a form of an electromagnetic wave. The input/output apparatus, such as a touchscreen, a display, or a keyboard, is mainly configured to: receive data entered by users, and output data to users.

After the terminal device is powered on, the processor may read a software program in a storage unit, parse and execute instructions of the software program, and process data of the software program. When data needs to be sent in a wireless manner, the processor performs baseband processing on the to-be-sent data, and outputs a baseband signal to the radio frequency circuit. The radio frequency circuit processes the baseband signal to obtain a radio frequency signal, and sends the radio frequency signal to the outside in a form of an electromagnetic wave via the antenna. When data is sent to the terminal device, the radio frequency circuit receives a radio frequency signal via the antenna, further converts the radio frequency signal into a baseband signal, and outputs the baseband signal to the processor. The processor converts the baseband signal into data, and processes the data.

For ease of description, FIG. 10 shows one memory and one processor. An actual terminal device may include a plurality of processors and memories. The memory may also be referred to as a storage medium, a storage device, or the like. This is not limited in this embodiment of the present invention.

In an optional implementation, the processor may include a baseband processor and a central processing unit. The baseband processor is mainly configured to process a communication protocol and communication data. The central processing unit is mainly configured to: control the entire terminal device, execute a software program, and process data of the software program. The processor in FIG. 10 integrates functions of the baseband processor and the central processing unit. A person skilled in the art may understand that the baseband processor and the central processing unit may alternatively be processors independent of each other, and are connected by using a technology such as a bus. A person skilled in the art may understand that the terminal device may include a plurality of baseband processors to adapt to different network standards, the terminal device may include a plurality of central processing units to enhance a processing capability of the terminal device, and components of the terminal device may be connected via various buses. The baseband processor may also be expressed as a baseband processing circuit or a baseband processing chip. The central processing unit may also be expressed as a central processing circuit or a central processing chip. A function of processing the communication protocol and the communication data may be built in the processor, or may be stored in the storage unit in a form of a software program, and the processor executes the software program to implement a baseband processing function.

In an example, the antenna and the control circuit that have a transceiver function may be considered as a transceiver unit 1011 of the terminal device 1000, and the processor that has a processing function may be considered as a processing unit 1012 of the terminal device 1000. As shown in FIG. 10, the terminal device 1000 includes the transceiver unit 1011 and the processing unit 1012. The transceiver unit may also be referred to as a transceiver, a transceiver machine, a transceiver apparatus, or the like. Optionally, a component that is in the transceiver unit 1011 and that is configured to implement a receiving function may be considered as a receiving unit, and a component that is in the transceiver unit 1011 and that is configured to implement a sending function may be considered as a sending unit. In other words, the transceiver unit 1011 includes the receiving unit and the sending unit. For example, the receiving unit may also be referred to as a receive machine, a receiver, or a receiving circuit, and the sending unit may be referred to as a transmit machine, a transmitter, or a transmitting circuit. Optionally, the receiving unit and the sending unit may be one integrated unit, or may be a plurality of independent units. The receiving unit and the sending unit may be in one geographical location, or may be distributed in a plurality of geographical locations.

Figure 11:
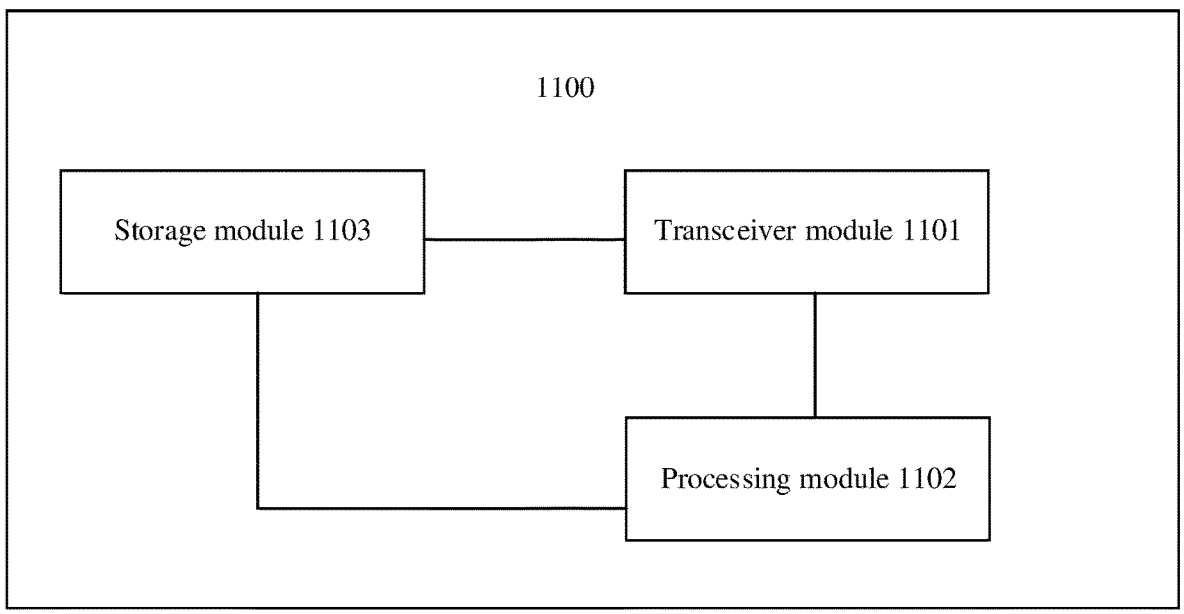
FIG. 11 is a schematic diagram of another communication apparatus according to an embodiment of this disclosure.

As shown in FIG. 11, another embodiment of this application provides an apparatus 1100. The apparatus may be a terminal, or may be a component (for example, an integrated circuit or a chip) of the terminal. Alternatively, the apparatus may be a network device, or may be a component (for example, an integrated circuit or a chip) of the network device. Alternatively, the apparatus may be another communication module configured to implement the method in the method embodiment of this application. The apparatus 1100 may include a processing module 1102 (or referred to as a processing unit). Optionally, the apparatus 1100 may further include a transceiver module 1101 (or referred to as a transceiver unit) and a storage module 1103 (or referred to as a storage unit).

In a possible design, one or more modules in FIG. 11 may be implemented by one or more processors, or may be implemented by one or more processors and memories, or may be implemented by one or more processors and transceivers, or may be implemented by one or more processors, memories, and transceivers. This is not limited in this embodiment of this application. The processor, the memory, and the transceiver may be separately disposed, or may be integrated together.

The apparatus has functions of implementing the terminal described in embodiments of this disclosure. For example, the apparatus includes a corresponding module, unit, or means used by the terminal to perform the steps that are related to the terminal and that are described in embodiments of this disclosure. The function, the unit, or the means may be implemented by software or hardware, or may be implemented by hardware executing corresponding software, or may be implemented by a combination of software and hardware. For details, refer to the corresponding descriptions in the foregoing corresponding method embodiments. Alternatively, the apparatus has functions of implementing the network device described in embodiments of this application. For example, the apparatus includes a corresponding module, unit, or means used by the network device to perform the steps that are related to the network device and that are described in embodiments of this application. The function, the unit, or the means may be implemented by software or hardware, or may be implemented by hardware executing corresponding software, or may be implemented by a combination of software and hardware. For details, refer to the corresponding descriptions in the foregoing corresponding method embodiments.

Optionally, the modules in the apparatus 1100 in this embodiment of this disclosure may be configured to perform the method described in FIG. 8.

In a possible design, one apparatus 1100 may include a processing module 1102 and a transceiver module 1101. The processing module 1102 is configured to: obtain T1 first to-be-coded data units and T2 second to-be-coded data units, and code the T1 first to-be-coded data units and the T2 second to-be-coded data units based on at least one of an extended reality data type corresponding to the T1 first to-be-coded data units or an extended reality data type corresponding to the T2 second to-be-coded data units, to obtain K coded data units, where T1 and T2 are integers greater than or equal to 1, and K is an integer greater than or equal to T1+T2. The transceiver module 1101 is configured to output the K coded data units.

According to the foregoing apparatus, in a process of coding XR data, coding of the XR data can be completed based on different dimensions or different QoS requirements of the XR data, so as to improve coding efficiency of the XR data, and improve utilization efficiency of limited air interface resources.

In some possible implementations of the apparatus 1100, the extended reality data type corresponding to the T1 first to-be-coded data units includes extended reality base layer data, and the extended reality data type corresponding to the T2 second to-be-coded data units includes extended reality enhancement layer data. Optionally, the extended reality base layer data and the extended reality enhancement layer data may be extended reality data obtained by performing source coding on XR source data, and source coding may be, for example, high efficiency video coding (HEVC) or scalability extension of HEVC (SHVC). According to this implementation, in a process of coding XR data, coding of the XR data can be completed based on requirements of different XR data types for QoS, so as to improve coding efficiency of the XR data, improve utilization efficiency of limited air interface resources, and ensure a QoS requirement of the XR data by using a limited resource with reference to coding.

In some possible implementations of the apparatus 1100, the extended reality data type corresponding to the T1 first to-be-coded data units includes extended reality in-field of view (FoV) data, and the extended reality data type corresponding to the T2 second to-be-coded data units includes extended reality out-of-FoV data. Optionally, the extended reality in-FoV data and the extended reality out-of-FoV data may be extended reality data obtained by performing FoV source coding on XR source data. FoV source coding may divide the XR source data into an in-angle-of-view part and an out-of-angle-of-view part. Generally, an angle of view of an FoV is approximately 60 to 150 degrees. The in-angle-of-view part corresponds to the extended reality in-FoV data, and the out-of-angle-of-view part corresponds to the extended reality out-of-FoV data. According to this implementation, in a process of coding XR data, coding of the XR data can be completed based on a visual presentation requirement of the XR data, so as to improve coding efficiency of the XR data, improve utilization efficiency of limited air interface resources, and improve visual experience of users on an XR service by using a limited resource with reference to coding.

In some possible implementations of the apparatus 1100, the extended reality data type corresponding to the T1 first to-be-coded data units includes video data, and the extended reality data type corresponding to the T2 second to-be-coded data units includes data (for example, audio data) other than the video data type. According to this implementation, in a process of coding XR data, coding of the XR data can be completed based on a visual presentation requirement and another user awareness (for example, auditory) presentation requirement of the XR data, so as to improve coding efficiency of the XR data, improve utilization efficiency of limited air interface resources, and improve integrated experience of users on an XR service by using a limited resource with reference to coding.

In some possible implementations of the apparatus 1100, that the processing module 1102 is configured to code the T1 first to-be-coded data units and the T2 second to-be-coded data units based on at least one of an extended reality data type corresponding to the T1 first to-be-coded data units or an extended reality data type corresponding to the T2 second to-be-coded data units specifically includes:

The processing module 1102 is configured to: obtain a coding matrix H based on the least one of the extended reality data type corresponding to the T1 first to-be-coded data units or the extended reality data type corresponding to the T2 second to-be-coded data units; and code the T1 first to-be-coded data units and the T2 second to-be-coded data units based on the coding matrix H. Optionally, the coding matrix H includes a coding submatrix $\tilde{H}$, the coding submatrix $\tilde{H}$ includes T1 first coding vectors and T2 second coding vectors, the T1 first coding vectors respectively correspond to the T1 first to-be-coded data units, and the T2 second coding vectors respectively correspond to the T2 second to-be-coded data units.

In a possible implementation of the first coding vector and the second coding vector, a quantity of non-zero coefficients included in any one of the T1 first coding vectors is greater than a quantity of non-zero coefficients included in any one of the T2 second coding vectors. Optionally, the quantity of non-zero coefficients included in the any one of the T2 second coding vectors is less than a coding depth M.

In another possible implementation of the first coding vector and the second coding vector, a quantity of non-zero coefficients included in one of the T1 first coding vectors is greater than a quantity of non-zero coefficients included in one of the T2 second coding vectors. Optionally, the quantity of non-zero coefficients included in the any one of the T2 second coding vectors is less than a coding depth M.

According to the foregoing implementations of the first coding vector and the second coding vector, coding protection stronger than that of the second to-be-coded data unit can be provided for the first to-be-coded data unit based on the extended reality data type corresponding to the first to-be-coded data unit and the extended reality data type corresponding to the second to-be-coded data unit.

It can be understood that, in some scenarios, some optional features in embodiments of this application may be independently implemented without depending on another feature, for example, a solution on which the optional features are currently based, to resolve a corresponding technical problem and achieve a corresponding effect. Alternatively, in some scenarios, the optional features are combined with other features based on requirements. Correspondingly, the apparatus provided in embodiments of this application may also correspondingly implement these features or functions. Details are not described herein.

A person skilled in the art may further understand that various illustrative logical blocks and steps that are listed in embodiments of this application may be implemented by electronic hardware, computer software, or a combination thereof. Whether the functions are implemented by hardware or software depends on particular applications and design requirements of the entire system. A person skilled in the art may use various methods to implement the functions for corresponding applications, but it should not be considered that the implementation goes beyond the scope of embodiments of this application.

It can be understood that the processor in embodiments of this disclosure may be an integrated circuit chip, and has a signal processing capability. In an implementation process, steps in the foregoing method embodiments can be implemented by using a hardware integrated logical circuit in the processor, or by using instructions in a form of software. The foregoing processor may be a general-purpose processor, a digital signal processor (DSP), an application-specific integrated circuit (ASIC), a field programmable gate array (FPGA) or another programmable logic device, a discrete gate or transistor logic device, or a discrete hardware component.

The solutions described in this disclosure may be implemented in various manners. For example, these technologies may be implemented by hardware, software, or a combination thereof. For hardware implementation, a processing unit configured to perform these technologies at a communication apparatus (for example, a base station, a terminal, a network entity, or a chip) may be implemented in one or more general-purpose processors, a DSP, a digital signal processor, an ASIC, a programmable logic device, an FPGA or another programmable logic apparatus, a discrete gate or transistor logic device, a discrete hardware component, or any combination thereof. The general-purpose processor may be a microprocessor. Optionally, the general-purpose processor may alternatively be any conventional processor, controller, microcontroller, or state machine. The processor may alternatively be implemented by a combination of computing apparatuses, such as a digital signal processor and a microprocessor, a plurality of microprocessors, one or more microprocessors with one digital signal processor core, or any other similar configuration.

It can be understood that the memory in embodiments of this disclosure may be a transitory memory or a non-transitory memory, or may include a transitory memory and a non-transitory memory. The non-transitory memory may be a read-only memory (ROM), a programmable read-only memory (PROM), an erasable programmable read-only memory (EPROM), an electrically erasable programmable read-only memory (EEPROM), or a flash memory. The transitory memory may be a random access memory (RAM) that is used as an external cache. By way of example and not limitation, many forms of RAMs may be used, for example, a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchlink dynamic random access memory (SLDRAM), and a direct rambus random access memory (DR RAM). It can be noted that the memory of the system and method described in this specification includes but is not limited to these memories and any memory of another appropriate type.

This disclosure further provides a computer-readable medium. The computer-readable medium stores a computer program. When the computer program is executed by a computer, functions of any one of the foregoing method embodiments are implemented.

This disclosure further provides a computer program product. When the computer program product is executed by a computer, functions of any one of the foregoing method embodiments are implemented.

All or some of the foregoing embodiments may be implemented by software, hardware, firmware, or any combination thereof. When software is used to implement embodiments, all or some of embodiments may be implemented in a form of a computer program product. The computer program product includes one or more computer instructions. When the computer instructions are loaded and executed on a computer, all or some of the procedures or functions according to embodiments of this disclosure are generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, for example, a server or a data center, integrating one or more usable media. The usable medium may be a magnetic medium (for example, a floppy disk, a hard disk, or a magnetic tape), an optical medium (for example, a high-density digital video disc (DVD)), a semiconductor medium (for example, a solid-state drive (SSD)), or the like.

It can be understood that "an embodiment" mentioned in this specification means that particular features, structures, or characteristics related to the embodiment are included in at least one embodiment of this application. Therefore, embodiments in this specification do not necessarily mean a same embodiment. In addition, these particular features, structures, or characteristics may be combined in one or more embodiments in any appropriate manner. It can be understood that sequence numbers of the foregoing processes do not mean an execution sequence in various embodiments of this application. The execution sequence of the processes should be determined based on functions and internal logic of the processes, and should not be construed as any limitation on the implementation processes of embodiments of this application.

It can be understood that, in this application, "when" and "if" mean that an apparatus performs corresponding processing in an objective situation, and are not intended to limit a time. In addition, the terms do not mean that the apparatus is required to have a determining action during implementation, and do not mean any other limitations.

In this disclosure, "simultaneously" may be understood as being at a same time point, or may be understood as being within a time period, or may be understood as being within a same periodicity.

A person skilled in the art may understand that various numbers such as "first" and "second" in this application are merely used for ease of distinguishing, and are not intended to limit the scope of embodiments of this application. A specific value of a number (which may also be referred to as an index), a specific value of a quantity, and a location in this application are merely used as examples, but are not unique representation forms, and are not used to limit the scope of embodiments of this application. Various numbers such as "first" and "second" in this application are also merely used for ease of distinguishing, and are not used to limit the scope of embodiments of this application.

In this disclosure, an element represented in a singular form is intended to represent "one or more", but does not represent "one and only one", unless otherwise specified.

Unless otherwise specified, "at least one" is intended to represent "one or more", and "a plurality of" is intended to represent "two or more".

In addition, terms "system" and "network" in this specification may be used interchangeably. A term "and/or" in this specification describes only an association relationship between associated objects and represents that three relationships may exist. For example, A and/or B may represent the following three cases: Only A exists, both A and B exist, and only B exists, where A may be singular or plural, and B may be singular or plural. A character "/" generally indicates an "or" relationship between the associated objects.

A term "at least one of" or "at least one piece of" in this specification represents all combinations or any combination of listed items. For example, "at least one of A, B, and C" may indicate the following six cases: Only A exists, only B exists, only C exists, both A and B exist, both B and C exist, and A, B, and C all exist, where A may be singular or plural, B may be singular or plural, and C may be singular or plural.

It can be understood that, in embodiments of this disclosure, "B corresponding to A" represents that B is associated with A, and B may be determined based on A. However, it can be further understood that determining B based on A does not mean that B is determined based only on A. B may alternatively be determined based on A and/or other information.

The correspondences shown in the tables in this application may be configured, or may be predefined. Values of the information in the tables are merely examples, and other values may be configured. This is not limited in this application. When a correspondence between information and each parameter is configured, not all the correspondences shown in the tables need to be configured. For example, in the tables in this disclosure, correspondences shown in some rows may alternatively be not configured. For another example, appropriate deformations and adjustments such as splitting and combination may be performed based on the foregoing tables. Names of the parameters shown in titles of the foregoing tables may alternatively be other names that can be understood by a communication apparatus, and values or representation manners of the parameters may alternatively be other values or representation manners that can be understood by the communication apparatus. During implementation of the foregoing tables, another data structure, such as an array, a queue, a container, a stack, a linear table, a pointer, a linked list, a tree, a graph, a structure, a class, a pile, or a hash table, may alternatively be used.

In this application, "predefine" may be understood as "define", "define in advance", "store", "pre-store", "pre-negotiate", "pre-configure", "solidify", or "pre-burn".

A person of ordinary skill in the art may understand that units and algorithm steps in the examples described with reference to embodiments disclosed in this specification can be implemented by electronic hardware or a combination of computer software and electronic hardware. Whether these functions are performed by hardware or software depends on particular applications and design constraints of the technical solutions. A person skilled in the art may use different methods to implement the described functions for each particular application, but it should not be considered that the implementation goes beyond the scope of this application.

A person of ordinary skill in the art may understand that, for the purpose of convenient and brief description, for a detailed working process of the foregoing system, apparatus, and unit, refer to a corresponding process in the foregoing method embodiments. Details are not described herein again.

It can be understood that the system, apparatus, and method described in this application may alternatively be implemented in another manner. For example, the described apparatus embodiment is merely an example. For example, division into the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may be or may not be physically separate, and parts displayed as units may be or may not be physical units, that is, may be located in one location, or may be distributed on a plurality of network units. Some or all of the units may be selected based on actual requirements to achieve the objectives of the solutions of embodiments.

In addition, function units in embodiments of this application may be integrated into one processing unit, or each of the units may exist alone physically, or two or more units may be integrated into one unit.

When the functions are implemented in a form of a software function unit and sold or used as an independent product, the functions may be stored in a computer-readable storage medium. Based on such an understanding, the technical solutions of this application essentially, or the part contributing to the conventional technology, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in embodiments of this application. The foregoing storage medium includes any medium that can store program code, such as a USB flash drive, a removable hard disk, a read-only memory (ROM), a random access memory (RAM), a magnetic disk, or an optical disc.

For same or similar parts in embodiments of this disclosure, refer to each other. In embodiments and the implementations/implementation methods in embodiments of this disclosure, unless otherwise specified or a logical conflict occurs, terms and/or descriptions are consistent and may be mutually referenced between different embodiments and between the implementations/implementation methods in embodiments. Technical features in different embodiments and the implementations/implementation methods in embodiments may be combined to form a new embodiment, implementation, or implementation method according to an internal logical relationship thereof. The foregoing implementations of this application are not intended to limit the protection scope of this disclosure.

The foregoing descriptions are merely specific implementations, but are not intended to limit the protection scope of this disclosure. Any variation or replacement readily figured out by a person skilled in the art within the technical scope disclosed in this specification shall fall within the protection scope of the accompanying claims.

What is claimed is:

1. A coding method, comprising:
obtaining T1 first to-be-coded data units and T2 second to-be-coded data units, T1 and T2 being integers greater than or equal to 1;
coding the T1 first to-be-coded data units and the T2 second to-be-coded data units based on at least one of an extended reality data type corresponding to the T1 first to-be-coded data units or an extended reality data type corresponding to the T2 second to-be-coded data units, to obtain K coded data units, K being an integer greater than or equal to T1+T2; and
outputting the K coded data units, wherein:
coding the T1 first to-be-coded data units and the T2 second to-be-coded data units comprises:
obtaining a coding matrix based on the least one of the extended reality data type corresponding to the T1 first to-be-coded data units or the extended reality data type corresponding to the T2 second to-be-coded data units; and
coding the T1 first to-be-coded data units and the T2 second to-be-coded data units based on the coding matrix;
the coding matrix comprises a coding submatrix comprising T1 first coding vectors and T2 second coding vectors, the T1 first coding vectors respectively corresponding to the T1 first to-be-coded data units and the T2 second coding vectors respectively corresponding to the T2 second to-be-coded data units; and
the quantity of non-zero coefficients included in the any one of the T2 second coding vectors is less than a coding depth M, the coding depth being a maximum value of a quantity of to-be-coded data units that participate in coding when one coded data unit is obtained, M being an integer greater than 0 and less than or equal to T1+T2.

2. The method according to claim 1, wherein a quantity of non-zero coefficients included in one of the T1 first coding vectors is greater than a quantity of non-zero coefficients included in one of the T2 second coding vectors.

3. The method according to claim 1, wherein a quantity of non-zero coefficients included in any one of the T1 first coding vectors is greater than a quantity of non-zero coefficients included in any one of the T2 second coding vectors.

4. The method according to claim 1, wherein the extended reality data type corresponding to the T1 first to-be-coded data units comprise at least one of extended reality base layer data or extended reality in-field of view data, and the extended reality data type corresponding to the T2 second to-be-coded data units comprise at least one of extended reality enhancement layer data or extended reality out-of-field of view data.

5. An apparatus, comprising:
one or more processors; and
a memory having instructions stored thereon that, when executed by the one or more processors, cause the apparatus to:
obtain T1 first to-be-coded data units and T2 second to-be-coded data units, T1 and T2 being integers greater than or equal to 1;
code the T1 first to-be-coded data units and the T2 second to-be-coded data units based on at least one of an extended reality data type corresponding to the T1 first to-be-coded data units or an extended reality data type corresponding to the T2 second to-be-coded data units, to obtain K coded data units, K being an integer greater than or equal to T1+T2; and
output the K coded data units, wherein:
coding the T1 first to-be-coded data units and the T2 second to-be-coded data units comprises causing the apparatus to:
obtain a coding matrix based on the least one of the extended reality data type corresponding to the T1 first to-be-coded data units or the extended reality data type corresponding to the T2 second to-be-coded data units; and
code the T1 first to-be-coded data units and the T2 second to-be-coded data units based on the coding matrix;
the coding matrix comprises a coding submatrix comprising T1 first coding vectors and T2 second coding vectors, the T1 first coding vectors respectively corresponding to the T1 first to-be-coded data units and the T2 second coding vectors respectively corresponding to the T2 second to-be-coded data units; and
the quantity of non-zero coefficients included in the any one of the T2 second coding vectors is less than a coding depth M, the coding depth being a maximum value of a quantity of to-be-coded data units that participate in coding when one coded data unit is obtained, M being an integer greater than 0 and less than or equal to T1+T2.

6. The apparatus according to claim 5, wherein a quantity of non-zero coefficients included in one of the T1 first coding vectors is greater than a quantity of non-zero coefficients included in one of the T2 second coding vectors.

7. The apparatus according to claim 5, wherein a quantity of non-zero coefficients included in any one of the T1 first coding vectors is greater than a quantity of non-zero coefficients included in any one of the T2 second coding vectors.

8. The apparatus according to claim 5, wherein the extended reality data type corresponding to the T1 first to-be-coded data units comprise at least one of extended reality base layer data or extended reality in-field of view data, and the extended reality data type corresponding to the T2 second to-be-coded data units comprise at least one of extended reality enhancement layer data or extended reality out-of-field of view data.

9. A non-transitory computer readable medium storing instructions that are executable by a first communication apparatus having at least one processor, the instructions upon execution by the at least one processor causing the first communication apparatus to:
obtain T1 first to-be-coded data units and T2 second to-be-coded data units, wherein T1 and T2 are integers greater than or equal to 1;
code the T1 first to-be-coded data units and the T2 second to-be-coded data units based on at least one of an extended reality data type corresponding to the T1 first to-be-coded data units or an extended reality data type corresponding to the T2 second to-be-coded data units, to obtain K coded data units, wherein K is an integer greater than or equal to T1+T2; and
output the K coded data units, wherein:
the coding the T1 first to-be-coded data units and the T2 second to-be-coded data units comprises:
obtaining a coding matrix based on the least one of the extended reality data type corresponding to the T1 first to-be-coded data units or the extended reality data type corresponding to the T2 second to-be-coded data units; and coding the T1 first to-be-coded data units and the T2 second to-be-coded data units based on the coding matrix;

the coding matrix comprises a coding submatrix comprising T1 first coding vectors and T2 second coding vectors, the T1 first coding vectors respectively corresponding to the T1 first to-be-coded data units and the T2 second coding vectors respectively corresponding to the T2 second to-be-coded data units; and the quantity of non-zero coefficients included in any one of the T2 second coding vectors being less than a coding depth M, the coding depth being a maximum value of a quantity of to-be-coded data units that participate in coding when one coded data unit is obtained, M being an integer greater than 0 and less than or equal to T1+T2.

10. The non-transitory computer readable medium according to claim 9, wherein a quantity of non-zero coefficients included in one of the T1 first coding vectors is greater than a quantity of non-zero coefficients comprised in one of the T2 second coding vectors.

11. The non-transitory computer readable medium according to claim 9, wherein a quantity of non-zero coefficients included in any one of the T1 first coding vectors being greater than a quantity of non-zero coefficients comprised in any one of the T2 second coding vectors.

* * * * *